(12) United States Patent
Taguchi et al.

(10) Patent No.: US 7,026,188 B2
(45) Date of Patent: Apr. 11, 2006

(54) ELECTRONIC DEVICE AND METHOD FOR MANUFACTURING THE SAME

(75) Inventors: Kazuyuki Taguchi, Hamura (JP); Norihiko Sugita, Ann Arbor, MI (US); Hideki Tanaka, Sagamihara (JP)

(73) Assignee: Renesas Technology Corp., Tokyo (JP)

( * ) Notice: Subject to any disclaimer, the term of this patent is extended or adjusted under 35 U.S.C. 154(b) by 257 days.

(21) Appl. No.: 10/481,463

(22) PCT Filed: Mar. 8, 2002

(86) PCT No.: PCT/JP02/02187

§ 371 (c)(1),
(2), (4) Date: Dec. 19, 2003

(87) PCT Pub. No.: WO03/001596

PCT Pub. Date: Jan. 3, 2003

(65) Prior Publication Data

US 2004/0235221 A1  Nov. 25, 2004

(30) Foreign Application Priority Data

Jun. 22, 2001 (JP) .............................. 2001-189893

(51) Int. Cl.
*H01L 21/50* (2006.01)
*H05K 3/32* (2006.01)

(52) U.S. Cl. .................. 438/108; 228/180.22

(58) Field of Classification Search ................ 438/108; 228/180.22
See application file for complete search history.

(56) References Cited

U.S. PATENT DOCUMENTS

| | | | |
|---|---|---|---|
| 4,735,847 A * | 4/1988 | Fujiwara et al. | 428/209 |
| 4,951,400 A * | 8/1990 | Elliott et al. | 34/442 |
| 5,075,965 A * | 12/1991 | Carey et al. | 29/840 |
| 5,328,087 A * | 7/1994 | Nelson et al. | 228/175 |
| 5,363,277 A | 11/1994 | Tanaka | 361/760 |
| 5,445,308 A * | 8/1995 | Nelson et al. | 228/121 |
| 5,448,114 A * | 9/1995 | Kondoh et al. | 257/778 |
| 5,804,874 A * | 9/1998 | An et al. | 257/676 |
| 6,111,322 A * | 8/2000 | Ando et al. | 257/778 |
| 6,150,724 A * | 11/2000 | Wenzel et al. | 257/777 |
| 6,489,181 B1 * | 12/2002 | Kado et al. | 438/108 |
| 6,553,660 B1 * | 4/2003 | Nakamura | 29/840 |
| 6,722,028 B1 * | 4/2004 | Nakamura | 29/832 |
| 2001/0005600 A1 * | 6/2001 | Ohuchi et al. | 438/106 |
| 2002/0023342 A1 * | 2/2002 | Nakamura | 29/832 |
| 2002/0135986 A1 * | 9/2002 | Nakamura | 361/719 |
| 2003/0135996 A1 * | 7/2003 | Nakamura | 29/840 |
| 2004/0166608 A1 * | 8/2004 | Nakamura | 438/118 |
| 2005/0167834 A1 * | 8/2005 | Ohuchi et al. | 257/738 |

FOREIGN PATENT DOCUMENTS

| | | |
|---|---|---|
| JP | 4-345041 | 12/1992 |
| JP | 5-175280 | 7/1993 |
| JP | 8-17838 | 1/1996 |
| JP | 9-83128 | 3/1997 |
| JP | 11-145613 | 5/1999 |

* cited by examiner

*Primary Examiner*—Evan Pert
(74) *Attorney, Agent, or Firm*—Miles & Stockbridge P.C.

(57) ABSTRACT

A manufacturing method of an electronic device comprises the steps of:

preparing a printed wiring board having a first region and a second region which differ from each other over one main surface thereof, a first electronic component having a plurality of first projection electrodes over one main surface thereof, and a second electronic component having a plurality of second projection electrodes which have a melting point higher than a melting point of the first projection electrodes over one main surface thereof;

mounting the first electronic component on the first region of one main surface of the printed wiring board by melting the plurality of first projection electrodes; and mounting the second electronic component on the second region of one main surface of the printed wiring board by compression-bonding the second electronic component while heating in a state that an adhesive resin is interposed between the second region of one main surface of the printed wiring board and one main surface of the second electronic component wherein the step of mounting the second electronic component is performed before the step of mounting the first electronic component.

37 Claims, 27 Drawing Sheets

FIG. 13
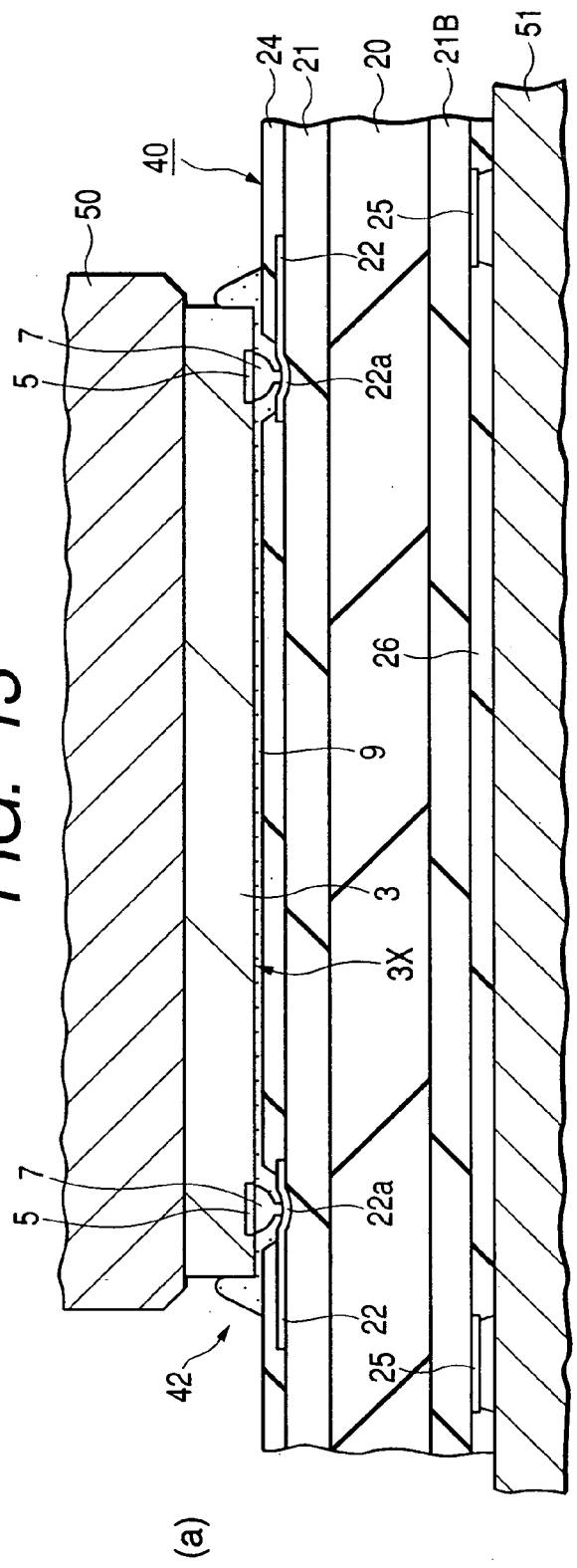
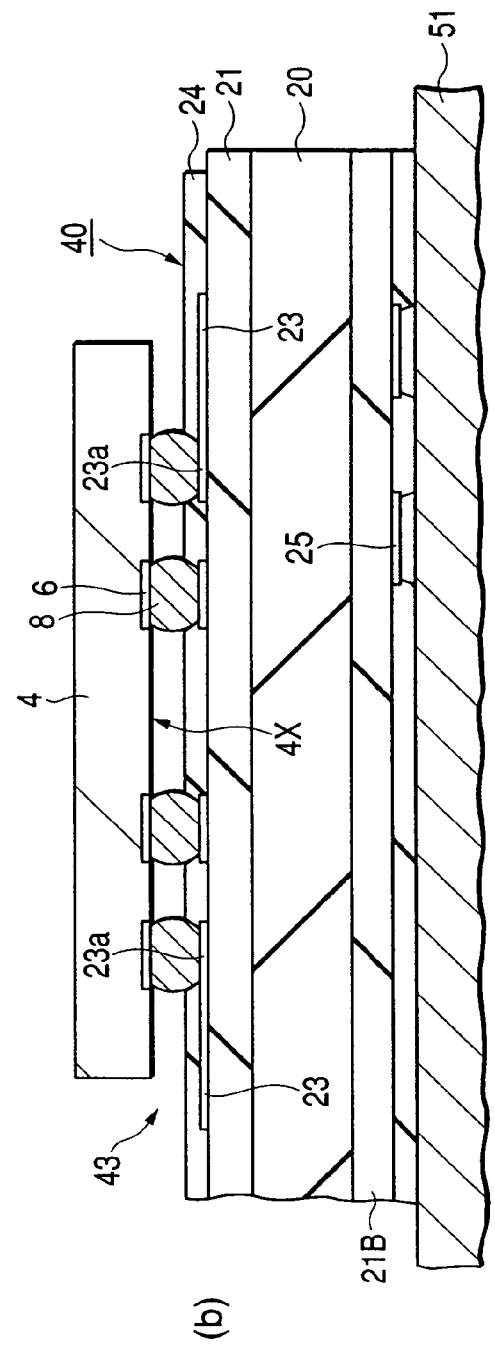

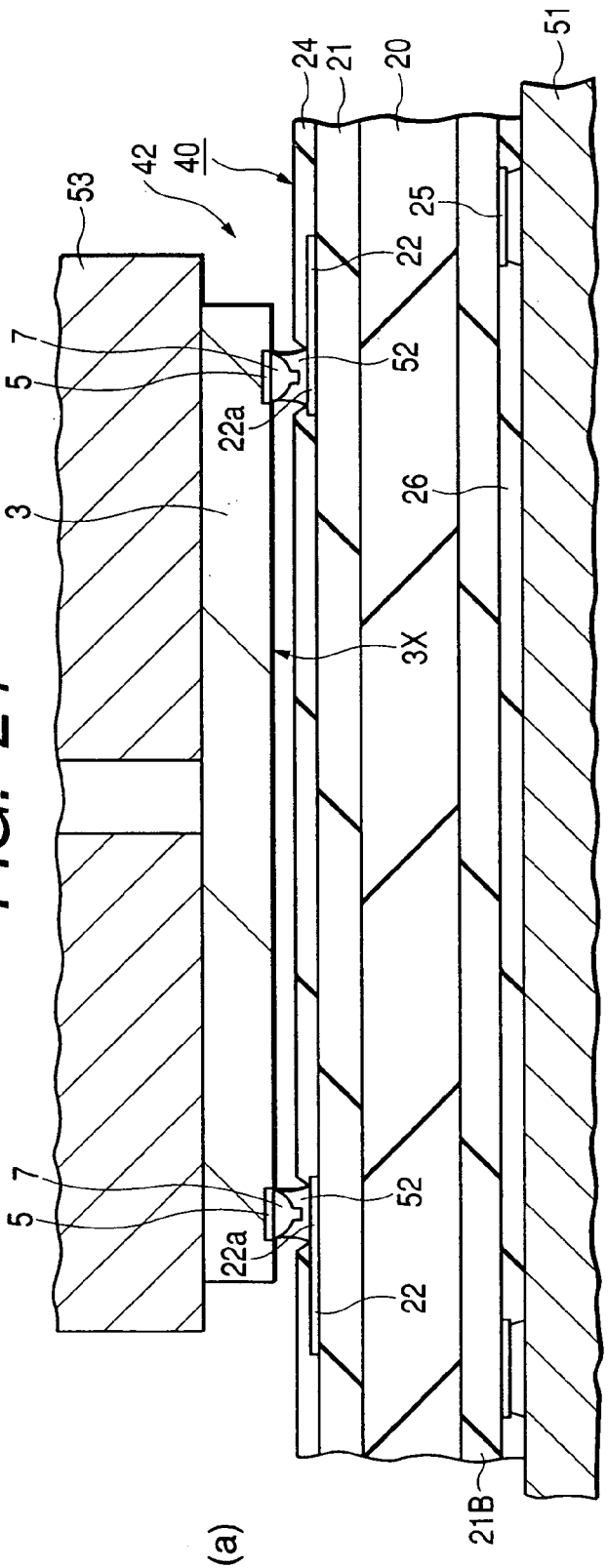
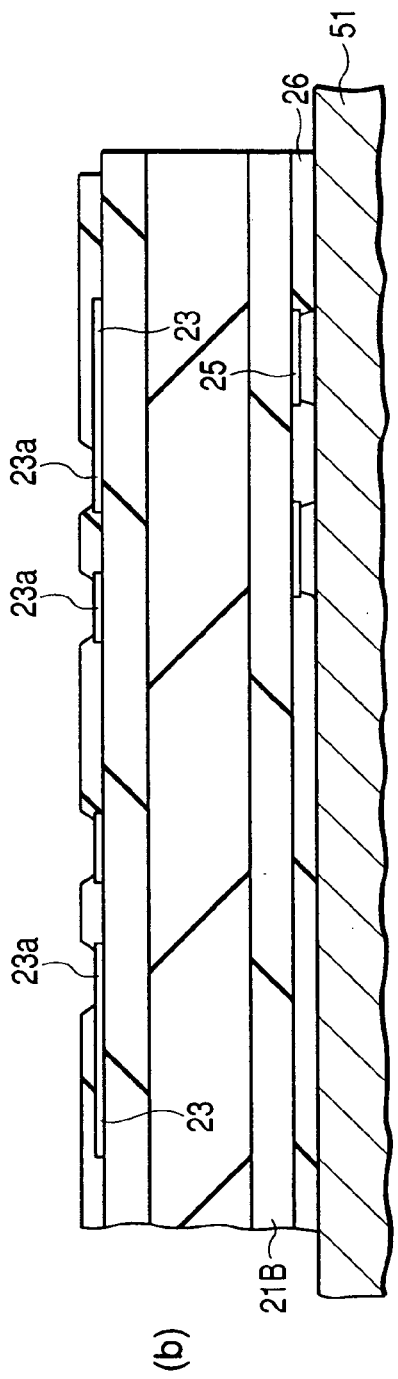
FIG. 24

ELECTRONIC DEVICE AND METHOD FOR MANUFACTURING THE SAME

TECHNICAL FIELD

The present invention relates to an electronic device and a manufacturing technique, and more particularly to a technique which is effectively applicable to an electronic device adopting a flip-chip packaging technique.

BACKGROUND ART

As an electronic device, for example, an electronic device referred to as an MCM (Multi Chip Module) is known. The MCM mounts a plurality of semiconductor chips each incorporating an integrated circuit therein on a printed wiring board on which a wiring pattern is formed and constitutes one compact function. In this MCM, to increase the data transfer speed and to achieve the miniaturization of the electronic device, the trend to adopt a flip-chip packaging technique has become active. The flip-chip packaging technique is a technique which mounts semiconductor chips each arranging projection electrodes on one main surfaces thereof on a printed wiring board.

With respect to the flip-chip packaging technique, various mounting methods have been proposed and put into practice. As typical mounting methods among these mounting methods, for example, a method which is referred to as CCB (Controlled Collapse Bonding) and a method which is referred to as ACF (Anisotropic Conductive Film) mounting have been put into practice.

The CCB mounting method is a method which uses semiconductor chips having solder bumps made of a metal material of lead(Pb)-tin(Sn) composition, for example, as projection electrodes on one main surface, wherein the semiconductor chips are mounted on the printed wiring board by melting the solder bumps. This CCB mounting method is, for example, described in "electronic material" [1996, April issue, pp.14–19] "published by Kogyo Chosakai".

As electronic components which are mounted on the printed wiring board by melting the solder bumps as in the case of the CCB mounting method, besides semiconductor chips (semiconductor chips for connecting solder bumps), there have been known semiconductor devices of a BGA (Ball Grid Array) type which packages semiconductor chips, a CSP (Chip Size Package or Chip Scale Package) type and the like. This type of semiconductor device mounts semiconductor chips on one main surface side of a printed wiring board which is referred to as an interposer and arranges semiconductor bumps as projection electrodes on another main surface (rear face) side which faces one main surface of the printed wiring board.

Further, in the CSP type semiconductor device, a CSP type semiconductor device having a new package structure which is manufactured by a manufacturing technique which integrates a wafer process (preceding step) and a package process (succeeding step) (wafer level CSP type semiconductor device) has been commercialized. In this wafer level CSP type semiconductor device, a planer size of the package is substantially equal to a planer size of the semiconductor chip and hence, it is possible to realize the miniaturization and the reduction of cost compared to the CSP type semiconductor device (chip level CSP type semiconductor device) which is manufactured by applying the packaging process to each semiconductor chip divided from a semiconductor wafer.

The wafer-level CSP type semiconductor device substantially includes a semiconductor chip layer, a rewiring layer (pad rearranging layer) which is formed over one main surface of the semiconductor chip layer and solder bumps which are arranged on the rewiring layer as projection electrodes. The semiconductor chip layer is substantially constituted of a semiconductor substrate, a multilayered wiring layer which is formed by stacking insulation layers and wiring layers respectively in a plural stages on one main surface of the semiconductor substrate and a surface protective film which is formed such that the surface protective film covers the multilayered wiring layer. Electrode pads are formed over an uppermost wiring layer out of the multilayered wiring layer and bonding openings which expose the electrode pads are formed in the surface protective film. The rewiring layer is a layer which is served for forming electrode pads having a wider arrangement pitch with respect to the electrode pads of the semiconductor chip layer. The electrode pads of the rewiring layer are electrically connected with the corresponding electrode pads of the semiconductor chip layer and are arranged at the same arrangement pitch with connecting portions which are arranged on a region of the printed wiring board on which the wafer level CSP type semiconductor devices are mounted. The solder bumps are arranged on the electrode pads of the rewiring layer and are electrically and mechanically connected with the electrode pads of the rewiring layer. The wafer level CSP type semiconductor devices are described in "Nikkei Micro Device" [1998, August issue, pp44–71] published by Nikkei Bp Ltd., for example.

Here, in this specification, the wafer level CSP type semiconductor device is also defined as a type of semiconductor chip.

The ACF mounting method is a method which uses semiconductor chips having stud bumps made of gold (Au), for example, as projection electrodes on one main surface and mounts the semiconductor chips on a printed wiring board by compression-bonding the semiconductor chips while heating the semiconductor chips in a state that an anisotropic conductive resin film (ACF) is interposed between the printed wiring board and the semiconductor chips as an adhesive resin. The anisotropic conductive resin film is a sheet which is produced by forming an insulation resin in which a large number of conductive particles are dispersed therein into a sheet shape, wherein an epoxy-based thermosetting type resin, for example, is used as the insulation resin. The stud bumps made of Au constitute balls by melting distal ends of Au wires and, thereafter, the balls are compression-bonded under heat to electrode pads which are arranged on one main surface of the semiconductor chip while applying ultrasonic vibration and, thereafter, ball portions are cut out from the Au wire thus forming the semiconductor chip. The ACF mounting method is, for example, described in Japanese unexamined patent publication 345041/1992 and Japanese unexamined patent publication 175280/1993.

As a mounting method which mounts semiconductor chips (stud-bump connection semiconductor chips) using thermo compression bonding as in the case of ACF mounting method, besides the ACF mounting method, there exists an NCF mounting method which uses an insulation resin film in which conductive particles are not mixed (NCF: non-conductive film) as an adhesive resin, an ACP mounting method which uses a paste-like anisotropic conductive resin (ACP: anisotropic conductive paste) and the like.

DISCLOSURE OF THE INVENTION

Here, the reduction of cost is also requested with respect to the MCM which adopts the flip-chip packaging technique. To achieve the reduction of cost of MCM, it is effective to use existing semiconductor chips as much as possible while obviating the development of semiconductor chips for an exclusive use.

To use the existing semiconductor chips as much as possible, it is necessary to mount semiconductor chips which differ in types of bumps in a mixed form. However, with respect to the conventional MCM, it has been generally manufactured using the semiconductor chips of the same type and hence, a process which manufactures the MCM in a state that the semiconductor chips which differ in types of bumps are mounted on the same printed wiring board in a mixed form has not been established.

Accordingly, inventors have reviewed the MCM which mounts two types of semiconductor chips which differ in types of bumps (solder-bump connection semiconductor chips, stud-bump connection semiconductor chips) on the same printed wiring board in a mixed form and have found out following drawbacks.

(1) Mounting of the solder-bump connection semiconductor chips is performed by melting the solder bumps based on a reflow method and hence, when the stud-bump connection semiconductor chips are mounted using the ACF mounting method before mounting the solder-bump connection semiconductor chips, heat which is used at the time of mounting the solder-bump connection semiconductor chips is applied to the anisotropic conductive resin. Since the anisotropic conductive resin uses an epoxy-based thermosetting type insulation resin as a main material, when the heat of high temperature is applied to the anisotropic conductive resin after thermosetting, bonding in the inside of the resin is broken and cracks are liable to be easily generated. According to the study carried out by the inventors, the generation of cracks remarkably took place by applying the heat having a temperature higher than a curing temperature of the resin.

The connection between the connecting portions of the printed wiring board and the stud bumps is held by a thermo shrinking force (shrinking force which is generated when the resin returns to an ordinary temperature state from a heated state), a thermo setting shrinking force (shrinking force which is generated when the thermosetting resin is cured) and the like of the anisotropic conductive resin which is interposed between the printed wiring board and the stud-bump connection semiconductor chips. Accordingly, when cracks are generated in the anisotropic conductive resin, the shrinking forces are lowered and this causes a connection failure whereby the reliability of the MCM is lowered. Accordingly, when the solder-bump connection semiconductor chips and the stud-bump connection semiconductor chips which are mounted by the ACF mounting method are mounted in a mixed form, an idea to prevent applying of heat of equal to or more than the curing temperature to the anisotropic conductive resin as much as possible becomes necessary.

(2) As a method which mounts the stud-bump connection semiconductor chips, besides a method which uses an adhesive resin such as the ACF mounting method, there exists a method which performs mounting of the semiconductor chips using previous solder (bonding material). In this case, by collectively mounting the stud-bump connection semiconductor chips with the solder-bump connection semiconductor chips, a mounting step can be simplified. However, when the solder-bump connection semiconductor chips and stud-bump connection semiconductor chips are collectively mounted, a yield rate of the MCM is lowered. The reason is as follows.

The stud-bump connection semiconductor chips do not have a rewiring layer and hence, the arrangement pitch of electrode pads to which the bumps are connected is narrower than the arrangement pitch of the electrode pads of the solder-bump connection semiconductor chip. Since the planer size of the electrode pads of the chip is regulated by the arrangement pitch of the electrode pads, the planer size becomes smaller corresponding to narrowing of the arrangement pitch of the electrode pads. Further, the size of the bump is regulated by the planer size of the electrode pad and hence, the size of the bump becomes smaller corresponding to the decrease of the planer size of the electrode pad. That is, with respect to the stud-bump connection semiconductor chips with the narrow arrangement pitch of the electrode pads, since the stud bumps are also small and hence, the connection failure derived from the positional displacement at the time of mounting is liable to easily occur.

Further, the stud bumps are formed of metal having a high melting point such as gold, aluminum or the like, for example, compared to Pb—Sn based solder or other solder. Accordingly, in mounting the semiconductor chips onto the printed wiring board, the stud bumps cannot be melted. This is because that when the heat treatment of a level which melts metal having a high melting point such as gold or aluminum is applied to the semiconductor chip, the electric characteristics of the semiconductor chip is largely changed before and after the heat treatment and hence, there arises a drawback that desired characteristics cannot be obtained. Accordingly, when the semiconductor chips having stud bumps made of gold or aluminum are mounted using the previous solder (bonding material), the mounting is performed by melting only the previous solder. When the mounting of the semiconductor chips using the above-mentioned method is performed, compared to the CCB method which mounts the semiconductor chips by melting the solder bumps, a position correction force which is obtained by a surface tension which the melted solder has becomes weak.

In this manner, since the semiconductor chips having the stud bumps (the stud-bump connection semiconductor chips) are formed over the small pads and hence, due to the fact that the diameter of the stud bumps is made small and the fact that the mounting is performed by melting only the previous solder so that the strong re-correction force cannot be obtained, there arises a drawback that the connection failure attributed to the positional displacement at the time of mounting is liable to easily occur.

It is an object of the present invention to provide a technique which is capable of enhancing the reliability of an electronic device.

It is another object of the present invention to provide a technique which is capable of enhancing a manufacturing yield rate of electronic devices.

The above-mentioned and other objects and novel features of the present invention will become apparent from the description of this specification and attached drawings.

To briefly explain the summary of typical inventions among the inventions described in this application, they are as follows.

(1) A manufacturing method of an electronic device comprises the steps of:

preparing a printed wiring board having a first region and a second region which differ from each other on one main surface thereof, a first electronic component having a plurality of first projection electrodes on one main surface thereof, and a second electronic component having a plurality of second projection electrodes which have a melting point higher than a melting point of the first projection electrodes on one main surface thereof;

mounting the first electronic component on the first region of one main surface of the printed wiring board by melting the plurality of first projection electrodes; and mounting the second electronic component on the second region of one main surface of the printed wiring board by compression-bonding the second electronic component while heating in a state that an adhesive resin is interposed between the second region of one main surface of the printed wiring board and one main surface of the second electronic component, wherein the step of mounting the second electronic component is performed after the step of mounting the first electronic component.

The adhesive resin is a thermosetting insulation resin, the plurality of first projection electrodes are solder bumps, and the plurality of second projection electrodes are stud bumps.

An arrangement pitch of the plurality of second projection electrodes is smaller than an arrangement pitch of the plurality of first projection electrodes.

The first and the second electronic components are formed of a semiconductor chip in which a circuit is incorporated.

The first electronic component is formed of a semiconductor chip which includes a semiconductor substrate, a plurality of semiconductor elements which are formed over one main surface of the semiconductor substrate, a plurality of first electrode pads which are formed over one main surface of the semiconductor substrate, a plurality of second electrode pads which are formed as a layer above the first electrode pads and are respectively electrically connected to the plurality of first electrode pads, the plurality of second electrode pads being arranged at an arrangement pitch wider than an arrangement pitch of the plurality of first electrode pads, and the plurality of first projection electrodes which are respectively connected to the plurality of second electrode pads, and the second electronic component is formed of a semiconductor chip which includes a semiconductor substrate, a plurality of semiconductor elements which are formed over one main surface of the semiconductor substrate, a plurality of electrode pads which are formed over one main surface of the semiconductor substrate, and the plurality of second projection electrodes which are respectively connected to the plurality of electrode pads.

The first electronic component is a semiconductor device which packages a semiconductor chip incorporating a circuit therein, and the second electronic component is a semiconductor chip incorporating a circuit therein.

(2) An electronic device comprises:

a printed wiring board having a first region and a second region which differ from each other;

a first electronic component which is mounted on the first region by way of a plurality of first projection electrodes; and a second electronic component which is mounted on the second region by way of a plurality of second projection electrodes which have a melting point higher than a melting point of the first projection electrodes.

The first projection electrodes are solder bumps and the second projection electrodes are stud bumps.

An arrangement pitch of the plurality of second projection electrodes is smaller than an arrangement pitch of the plurality of first projection electrodes.

The first and the second electronic components are formed of a semiconductor chip in which a circuit is incorporated.

The first electronic component is formed of a semiconductor chip which includes a semiconductor substrate, a plurality of semiconductor elements which are formed over one main surface of the semiconductor substrate, a plurality of first electrode pads which are formed over one main surface of the semiconductor substrate, a plurality of second electrode pads which are formed as a layer above the first electrode pads and are respectively electrically connected to the plurality of first electrode pads, the plurality of second electrode pads being arranged at an arrangement pitch wider than an arrangement pitch of the plurality of first electrode pads, and the plurality of first projection electrodes which are respectively connected to the plurality of second electrode pads, and the second electronic component is formed of a semiconductor chip which includes a semiconductor substrate, a plurality of semiconductor elements which are formed over one main surface of the semiconductor substrate, a plurality of electrode pads which are formed over one main surface of the semiconductor substrate, and the plurality of second projection electrodes which are respectively connected to the plurality of electrode pads.

The first electronic component is a semiconductor device which packages a semiconductor chip incorporating a circuit therein, and the second electronic component is a semiconductor chip incorporating a circuit therein.

(3) A manufacturing method of an electronic device comprises the steps of:

(a) preparing a printed wiring board having a first region and a second region which differ from each other on one main surface thereof, wherein a plurality of first connecting portions are arranged over the first region and a plurality of second connecting portions are arranged over the second region, a first electronic component having a plurality of first projection electrodes on one main surface thereof, and a second electronic component having a plurality of second projection electrodes which have a melting point higher than a melting point of the first projection electrodes on one main surface thereof;

(b) electrically connecting the plurality of second connecting portions and the plurality of second projection electrodes to each other by melting a bonding material having a melting point higher than a melting point of the first projection electrodes and lower than a melting point of the second projection electrodes; and (c) electrically connecting the plurality of first connecting portions and the plurality of first projection electrodes by melting the plurality of first projection electrodes, wherein the step (b) is performed before the step (c).

The plurality of first projection electrodes are solder bumps, and the plurality of second projection electrodes are stud bumps.

An arrangement pitch of the plurality of second projection electrodes is smaller than an arrangement pitch of the plurality of first projection electrodes.

The first and the second electronic components are formed of a semiconductor chip in which a circuit is incorporated.

The first electronic component is formed of a semiconductor chip which includes a semiconductor substrate, a plurality of semiconductor elements which are formed over one main surface of the semiconductor substrate, a plurality of first electrode pads which are formed over one main surface of the semiconductor substrate, a plurality of second electrode pads which are formed as a layer above the first electrode pads and are respectively electrically connected to the plurality of first electrode pads, the plurality of second electrode pads being arranged at an arrangement pitch wider than an arrangement pitch of the plurality of first electrode pads, and the plurality of first projection electrodes which are respectively connected to the plurality of second electrode pads, and the second electronic component is formed of a semiconductor chip which includes a semiconductor substrate, a plurality of semiconductor elements which are formed over one main surface of the semiconductor substrate, a plurality of electrode pads which are formed over one main surface of the semiconductor substrate, and the plurality of second projection electrodes which are respectively connected to the plurality of electrode pads.

The first electronic component is a semiconductor device which packages a semiconductor chip incorporating a circuit therein, and the second electronic component is a semiconductor chip incorporating a circuit therein.

(4) An electronic device comprises:

a printed wiring board having a first region and a second region which differ from each other, wherein a plurality of first connecting portions are arranged in the first region and a plurality of second connecting portions are arranged in the second region;

a first electronic component having a plurality of first projection electrodes on one main surface thereof; and a second electronic component having a plurality of second projection electrodes which have a melting point higher than a melting point of the first projection electrodes on one main surface thereof, wherein the plurality of first projection electrodes are respectively connected to the plurality of first connecting portions, and the plurality of second projection electrodes are respectively connected to the plurality of second connecting portions by way of a bonding material having a melting point higher than a melting point of the first projection electrodes and lower than a melting point of the second projection electrodes.

BRIEF DESCRIPTION OF THE DRAWINGS

FIG. 13 is a cross-sectional view of an essential part for explaining the manufacture of the MCM shown in FIG. 1 ((a) being a cross-sectional view taken at a position along a line A—A in FIG. 1, (b) being a cross-sectional view taken at a position along a line B—B in FIG. 1).

FIG. 24 is a cross-sectional view of an essential part for explaining the manufacture of an MCM of an embodiment 4 of the present invention ((a) being a cross-sectional view taken at the same position as a line C—C in FIG. 16, (b) being a cross-sectional view taken at the same position as a line D—D in FIG. 16).

BEST MODE FOR CARRYING OUT THE INVENTION

Embodiments of the present invention are explained in detail in conjunction with attached drawings hereinafter. In all drawings for explaining the embodiments of the present invention, same symbols are given to parts having identical functions and their repeated explanation is omitted. Further, in some cross-sectional views, to facilitate the understanding of the drawings, hatching which indicates a cross section is partially omitted.

(Embodiment 1)

Figure 1:
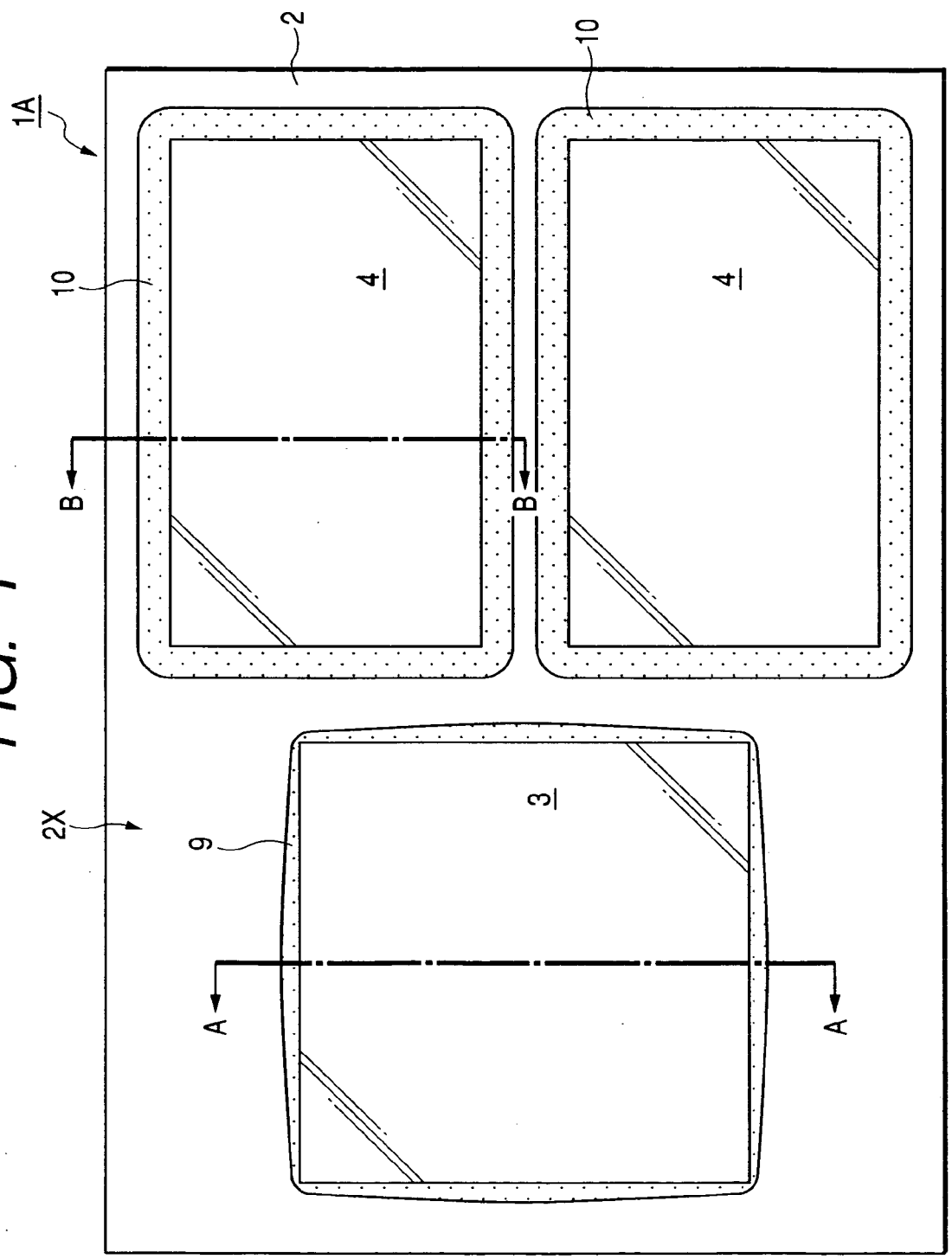
FIG. 1 is a plan view of an MCM which constitutes an embodiment 1 of the present invention.
Figure 2:
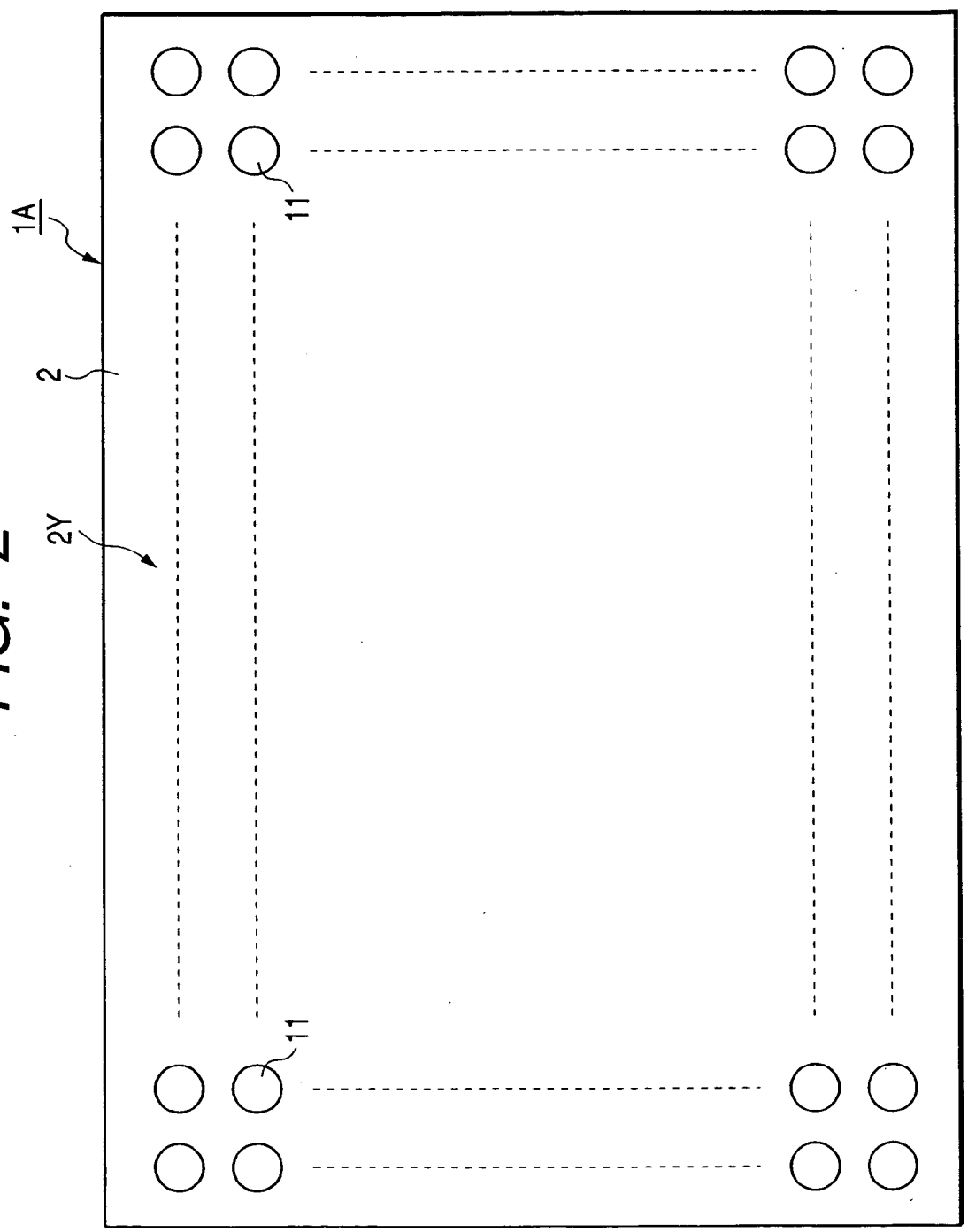
FIG. 2 is a bottom view of the MCM shown in FIG. 1.
Figure 3:
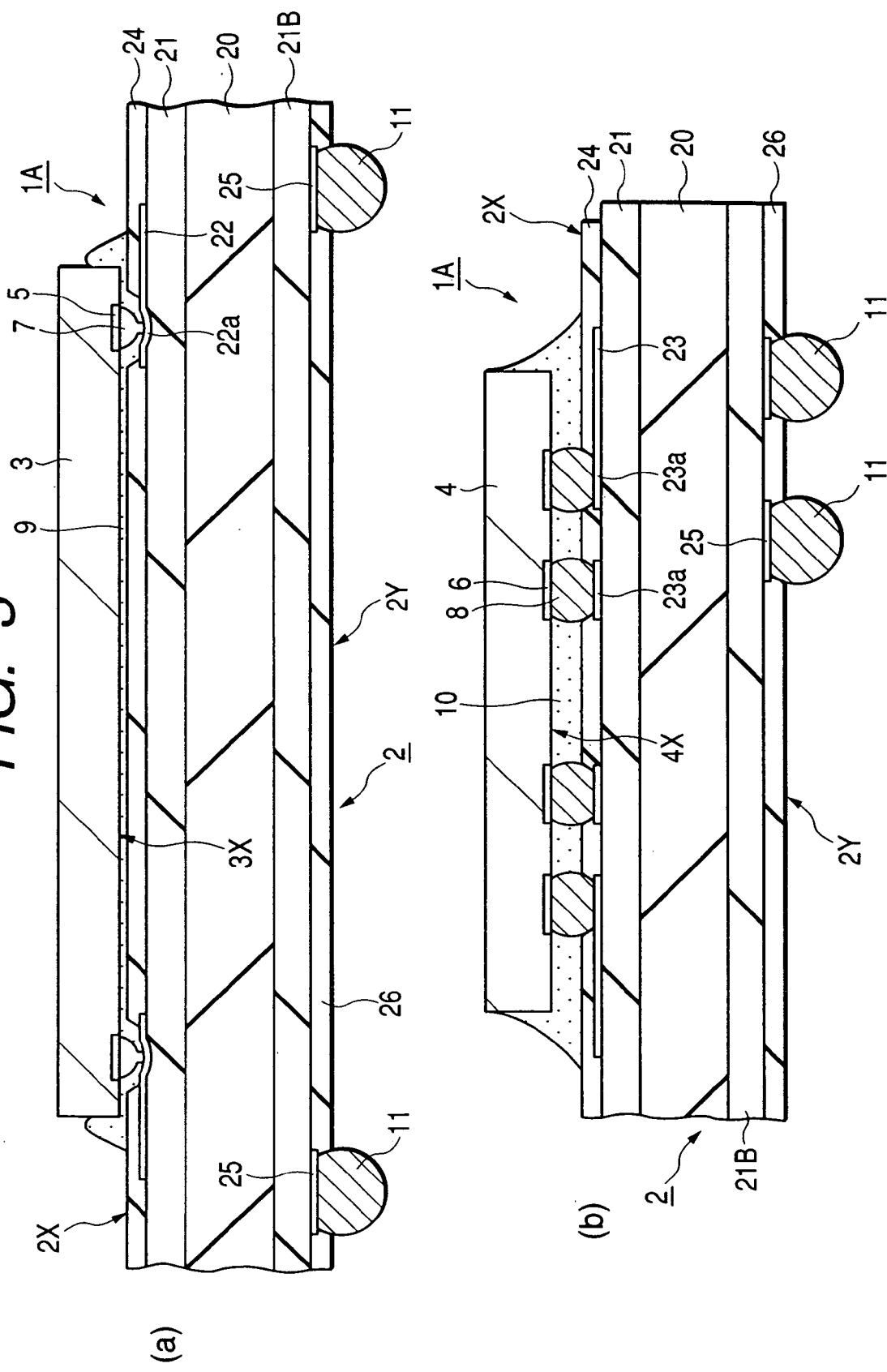
FIG. 3 is a cross-sectional view of an essential part of the MCM shown in FIG. 1 ((a) being a cross-sectional view taken along a line A—A in FIG. 1, (b) being a cross-sectional view taken along a line B—B in FIG. 1).
Figure 4:
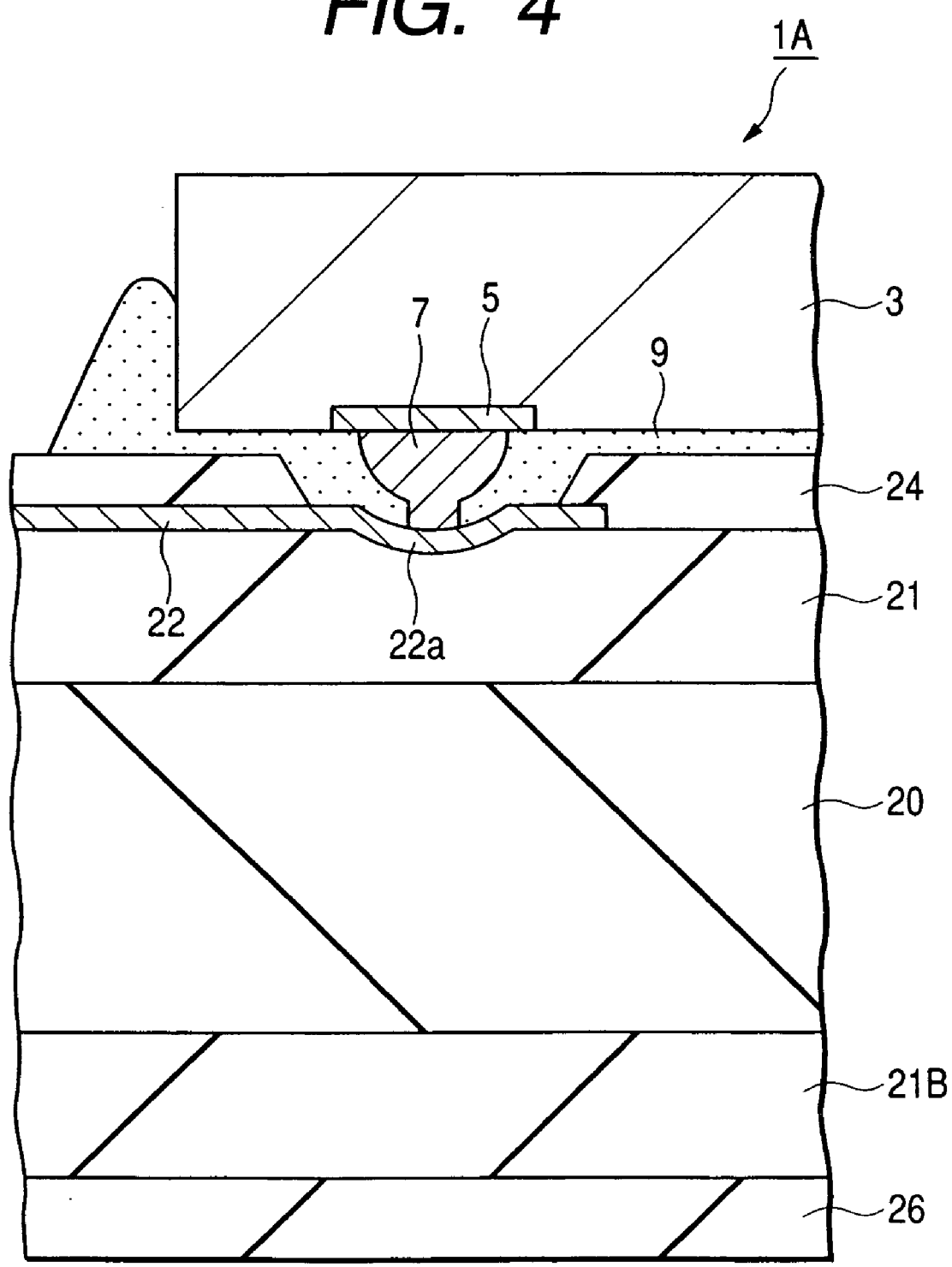
FIG. 4 is a cross-sectional view in an enlarged form of a portion of FIG. 3(*a*).
Figure 5:
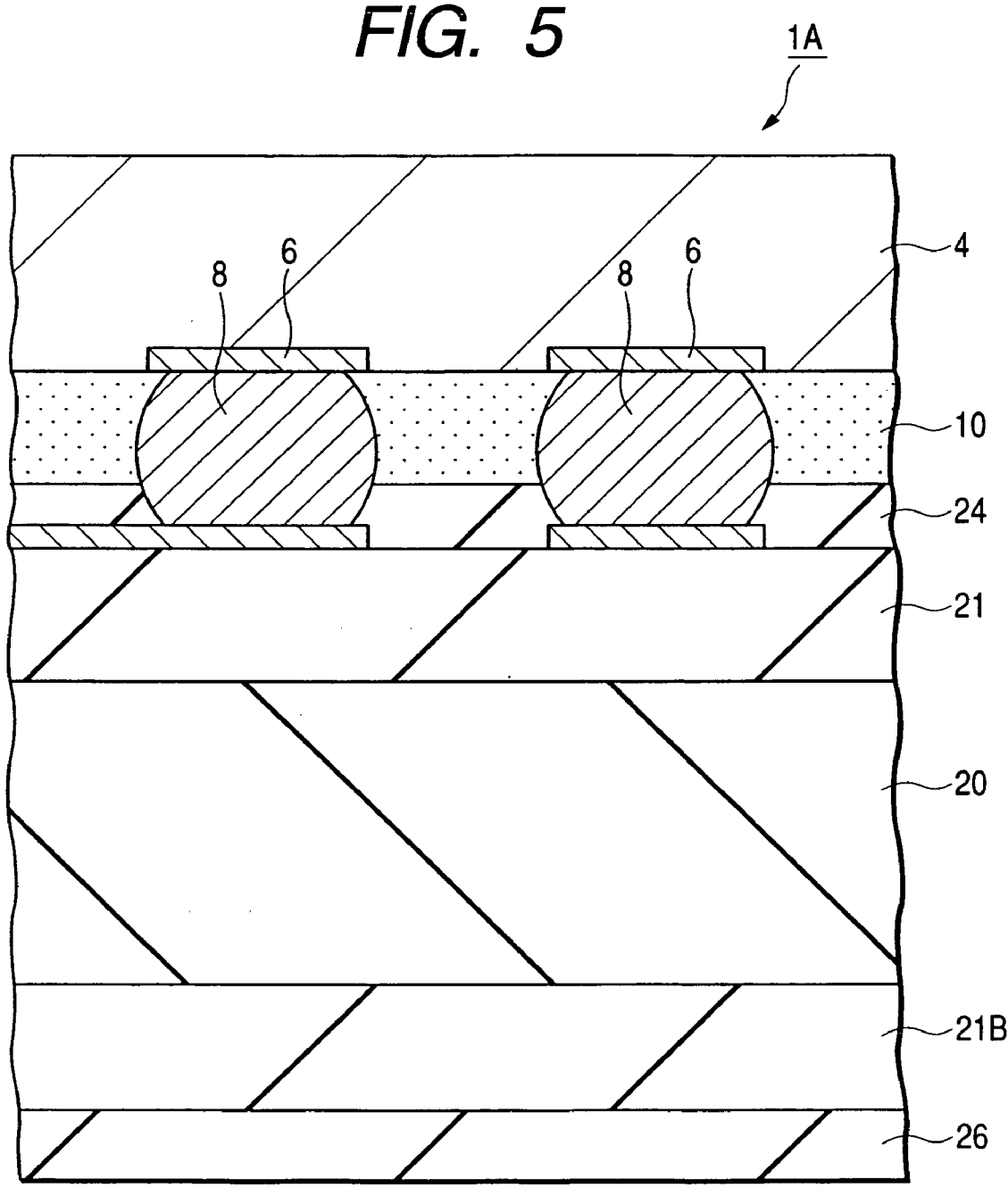
FIG. 5 is a cross-sectional view in an enlarged form of a portion of FIG. 3(*b*).
Figure 6:
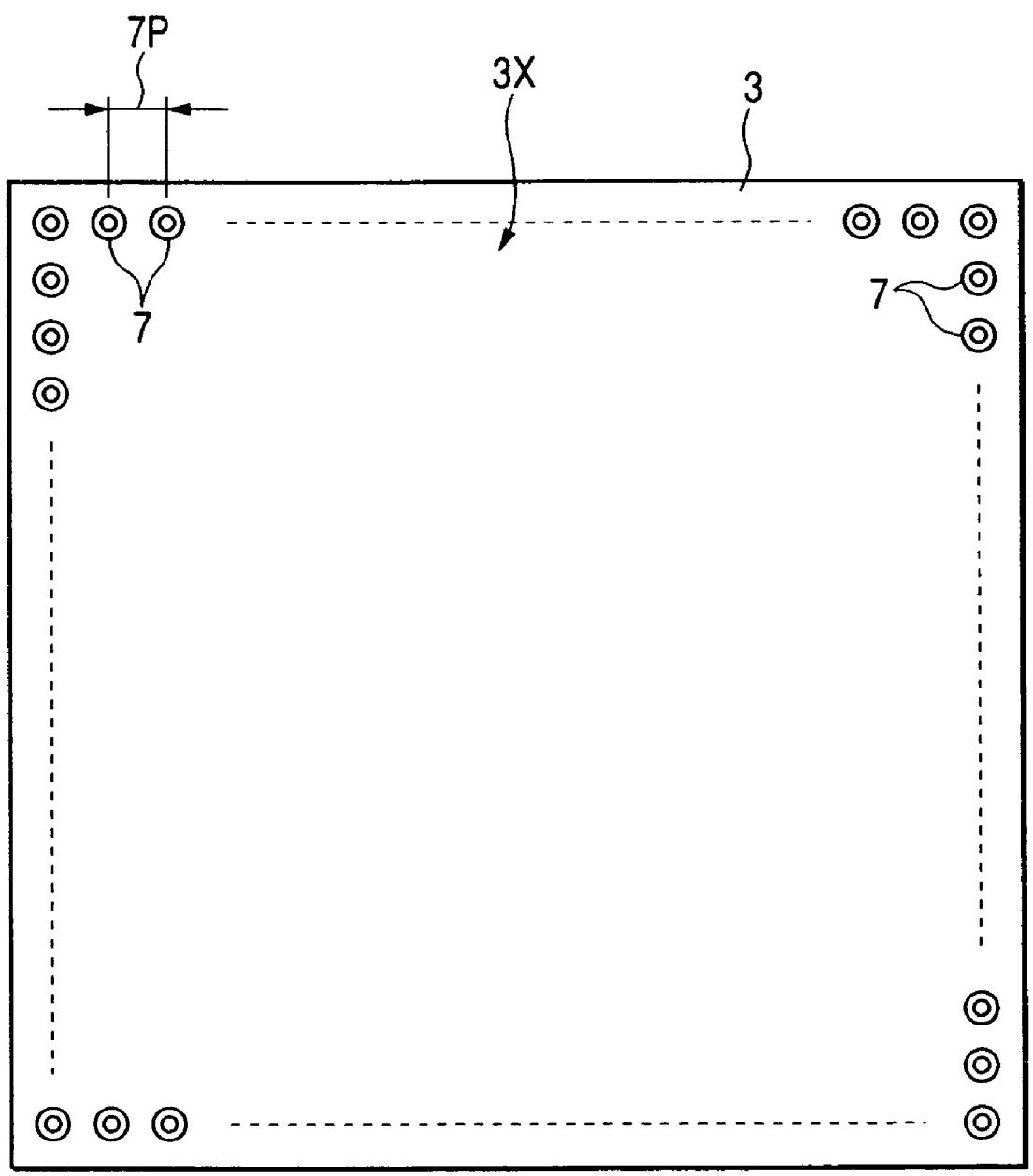
FIG. 6 is a plan view of a semiconductor chip (stud-bump connection semiconductor chip) shown in FIG. 1.
Figure 7:
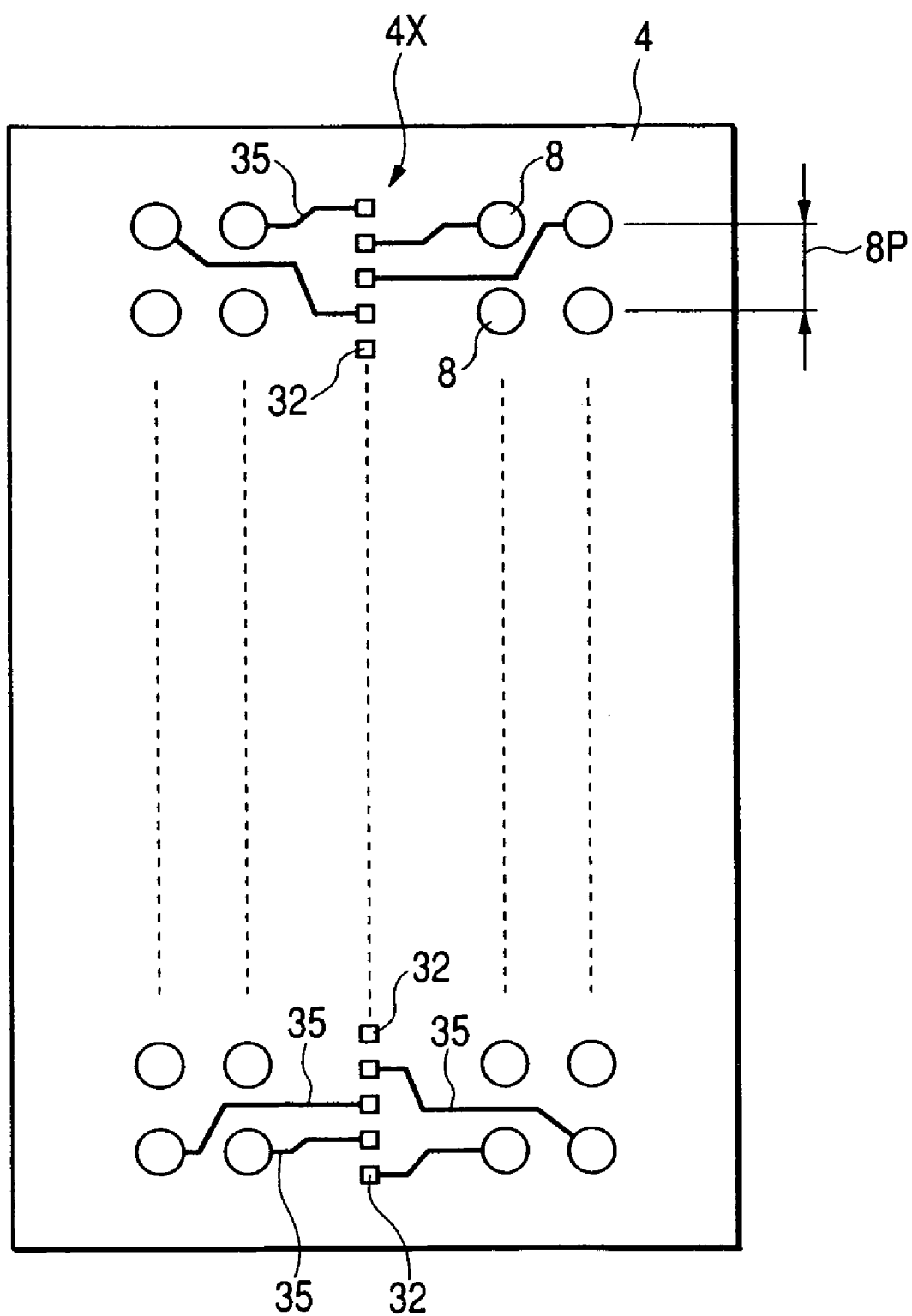
FIG. 7 is a plan view of a semiconductor chip (solder-bump connection semiconductor chip) shown in FIG. 1.
Figure 8:
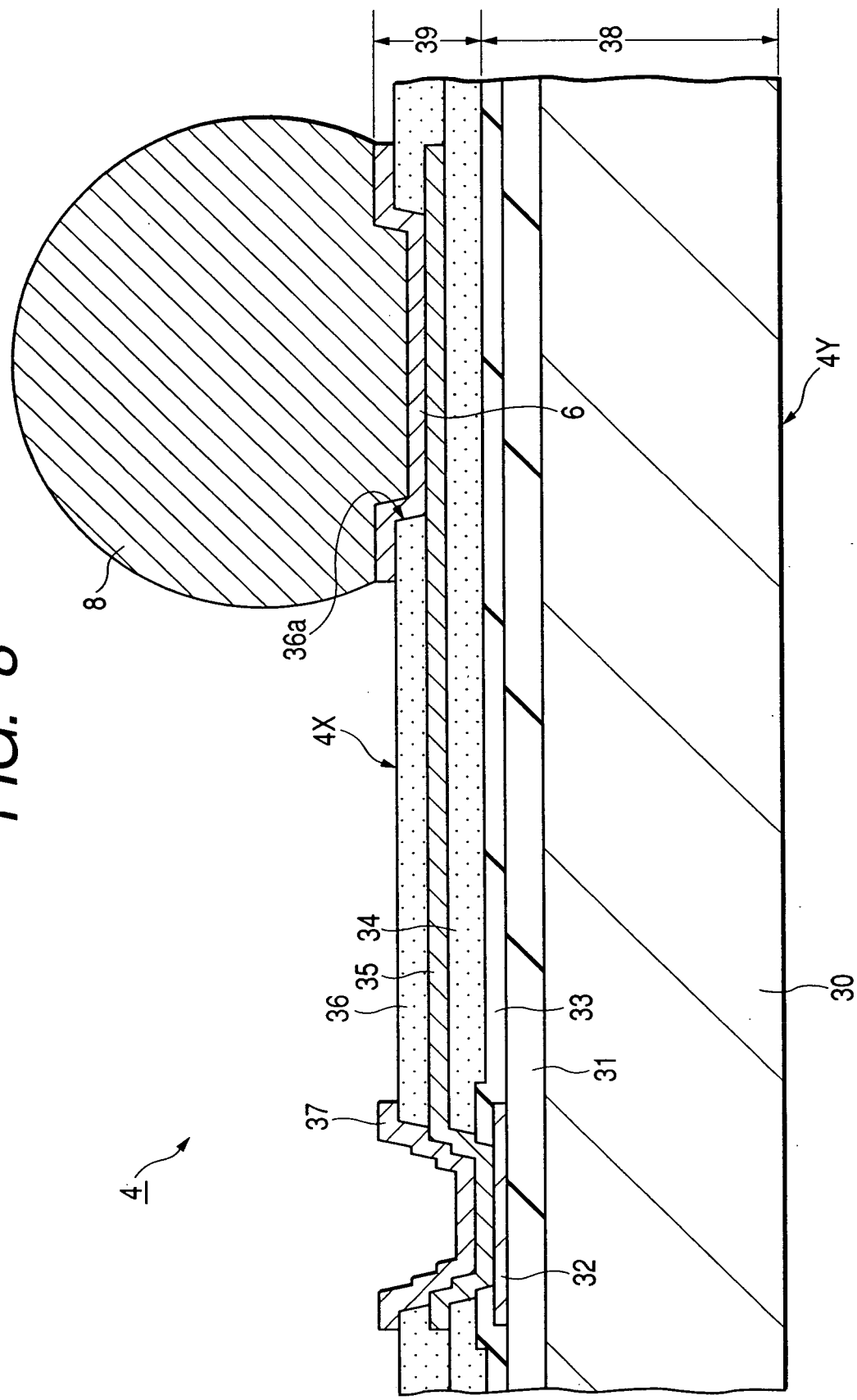
FIG. 8 is a cross-sectional view of an essential part of the semiconductor chip shown in FIG. 7.

FIG. 1 is a plan view of an MCM (electronic device) which constitutes an embodiment 1 of the present invention, FIG. 2 is a bottom view of the MCM shown in FIG. 1, FIG. 3 is a cross-sectional view of an essential part of the MCM shown in FIG. 1 ((a) being a cross-sectional view taken along a line A—A in FIG. 1, (b) being a cross-sectional view taken along a line B—B in FIG. 1), FIG. 4 is a cross-sectional view in an enlarged form of a portion of FIG. 3(a), FIG. 5 is a cross-sectional view in an enlarged form of a portion of FIG. 3(b), FIG. 6 is a plan view of a semiconductor chip (stud-bump connection semiconductor chip) shown in FIG. 1, FIG. 7 is a plan view of a semiconductor chip (solder-bump connection semiconductor chip) shown in FIG. 1, and FIG. 8 is a cross-sectional view of an essential part of the semiconductor chip shown in FIG. 7.

As shown in FIG. 1 to FIG. 3, an MCM-1A of this embodiment is configured such that one semiconductor chip (stud-bump connection semiconductor chip) 3 and two semiconductor chips (solder-bump connection semiconductor chips) 4 are mounted on one main surface 2X side of a printed wiring board 2 as electronic components, a plurality of solder bumps 11 which constitute external connection terminals are arranged on another main surface (back face) 2Y side of the printed wiring board 2 which faces one main surface 2X in an opposed manner. The semiconductor chip 3 incorporates a control circuit, for example, therein, while the semiconductor chip 4 incorporates an SDRAM (Synchronous Dynamic Random Access Memory) of 64 megabits, for example, as a memory circuit.

The printed wiring board 2 is configured to include, mainly a rigid substrate (core substrate) 20, soft layers 21, 21B which are formed over both faces of the rigid substrate 20 in an opposed manner by a build-up method, and protective films 24, 26 which are formed such that these films cover the soft layers 21, 21B. The rigid substrate 20 and the soft layers 21, 21B constitute, although not shown in detail in the drawings, a multi-layered wiring structure, for example. Respective insulation layers of the rigid substrate 20 are formed of a highly resilient resin substrate which is produced by impregnating an epoxy-based or polyimide-based resin into glass fiber, for example. Respective insulation layers of the soft layers 21, 21B are formed of an epoxy-based low resilient resin, for example. Respective wiring layers of the rigid substrate 20 and the soft layers 21, 21B are formed of a metal film made of copper (Cu), for example. The protective films 24 and 26 are formed of a polyimide-based resin, for example. The protective film 24 is formed mainly for the purpose of protecting wiring formed over an uppermost wiring layer of the soft layer 21, wherein the soft layer 21 plays the role of ensuring an adhesive force with an adhesive resin at the time of mounting with respect to the semiconductor chip 3 and controls spreading of solder wetting at the time of mounting with respect to the semiconductor chip 4. The protective film 26 is formed mainly for the purpose of protecting wiring formed over an uppermost wiring layer of the soft layer 21B, wherein the protective film 26 controls spreading of solder wetting at the time of forming bumps with respect to solder bumps 11.

Planer shapes of the semiconductor chip 3 and the semiconductor chip 4 are formed in a quadrangular shape. In this embodiment, the semiconductor chip 3 is formed in a square shape of 6.8 mm×6.8 mm, for example, while the semiconductor chip 4 is formed in a rectangular shape of 5.99×8.7 mm, for example. Further, in this embodiment, the semiconductor chip 3 and the semiconductor chip 4 are formed with a thickness of approximately 0.4 mm, for example.

The semiconductor chip 3 is, although not limited, mainly constituted of a semiconductor substrate, a plurality of semiconductor elements which are formed over one main surface of the semiconductor substrate, a multi-layered wiring layer which is formed by stacking insulation layers and wiring layers respectively in a plural stages on one main surface of the semiconductor substrate, and a surface protective film (final protective film) which is formed so as to cover the multi-layered wiring layer. The semiconductor substrate is formed of single crystalline silicon, for example, the insulation layers are formed of a silicon oxide film, for example, and the wiring layers are formed of a metal film made of aluminum (Al) or an aluminum alloy, for example. The surface protective film is formed of an insulation film made of silicon oxide or silicon nitride and an organic insulation film, for example.

On one main surface 3X out of one main surface 3X and another main surface (back face) of the semiconductor chip 3 which face each other in an opposed manner, a plurality of electrode pads 5 are formed. The plurality of electrode pads 5 are formed over the uppermost wiring layer of the multi-layered wiring layer of the semiconductor chip 3 and are exposed through bonding openings formed in the surface protective film of the semiconductor chip 3. The plurality of electrode pads 5 are arranged along respective sides of the semiconductor chip 3. A planer shape of each one of the plurality of electrode pads 5 is formed in a quadrangular shape of 70 [μm]×70 [μm], for example. Further, the plurality of electrode pads 5 are respectively arranged at an arrangement pitch of approximately 85 [µm], for example.

On one main surface 3X of the semiconductor chip 3, stud bumps 7 made of, for example, gold (Au) are arranged as projection electrodes. The plurality of stud bumps 7 are respectively arranged on the plurality of electrode pads 5 arranged on one main surface 3X of the semiconductor chip 3 and are electrically and mechanically connected with the electrode pads 5. The stud bumps 7 are, for example, formed by a ball bonding method which uses Au wires and ultrasonic vibration in heat compression bonding. The ball bonding method is a method in which balls are formed over distal end portions of the Au wires and, thereafter, the balls are compression-bonded with heat to the electrode pads of the chip by applying the ultrasonic vibration and, thereafter, the Au wires are cut out from the ball portions. Accordingly, the stud bumps formed over the electrode pads are firmly connected to the electrode pads.

The semiconductor chip 4 is, as shown in FIG. 8, mainly constituted of a semiconductor chip layer 38, a rewiring layer (pad rewiring layer) 39 which is formed over one main surface of this semiconductor chip layer 38 and a plurality of soldering bumps 8 which are arranged on this rewiring layer 39.

The semiconductor chip layer 38 is mainly constituted of a semiconductor substrate 30, a multilayered wiring layer 31 in which insulation layers and wiring layers are respectively stacked in plural stages on one main surface of this semiconductor substrate 30 and a surface protective film 33 which is formed so as to cover the multilayered wiring layer 31. The semiconductor substrate 30 is formed of single crystalline silicon, for example, the insulation layers of the multilayered wiring layer 31 are formed of an oxide silicon film, for example, the wiring layers of the multilayered wiring layer 31 are formed of an aluminum (Al) film or an aluminum alloy film, for example, and the surface protective film 33 is formed of a silicon nitride film, for example.

On a center portion of one main surface of the semiconductor chip layer 38, a plurality of electrode pads 32 which are arranged along the long-side direction of one main surface 4X of the semiconductor chip 4 are formed and arranged in a row along input/output circuit semiconductor elements formed over one main surface of the semiconductor substrate 30. The plurality of respective electrode pads 32 are formed over an uppermost wiring layer of the multilayered wiring layer 31. The uppermost wiring layer of the multilayered wiring layer 31 is covered with the surface protective film 33 which is formed above the uppermost wiring layer and openings which expose surfaces of the electrode pads 32 are formed in the surface protective film 33. A planer shape of the plurality of respective electrode pads 32 is formed in a quadrangular shape of 30 [µm]×30 [µm], for example. Further, the plurality of respective electrode pads 32 are arranged at an arrangement pitch of approximately 40 [µm], for example.

The rewiring layer 39 is mainly constituted of an insulation layer 34 which is formed over the surface protective film 33, a plurality of lines 35 which extend on the insulation layer 34, an insulation layer 36 which is formed over the insulation layer 34 so as to cover the plurality of lines 35, and a plurality of inspection electrode pads 37 and a plurality of electrode pads 6 which are formed above the insulation layer 36.

Respective one end sides of the plurality of lines 35 are respectively electrically and mechanically connected to the plurality of electrode pads 32 through openings formed in the insulation layer 34 and openings formed in the surface protective film 33. Substantially half of the plurality of lines 35 have respective another end sides thereof pulled out to one long side out of two long sides which face each other in an opposed manner on one main surface 4X of the semiconductor chip 4, while remaining lines 35 have end sides thereof pulled out to another long side.

The plurality of respective inspection electrode pads 37 are electrically and mechanically connected to respective one end sides of the plurality of lines 35 through openings formed in the insulation layer 36. The plurality of respective electrode pads 6 are electrically and mechanically connected to respective one end sides of the plurality of lines 35 through openings 36a formed in the insulation layer 36.

To the plurality of respective electrode pads 6, the plurality of solder bumps 8 which are arranged on the rewiring layer 39 are electrically and mechanically connected. The plurality of respective solder bumps 8 are formed of a metal member (Pb free material) made of Sn—1 [wt %] Ag(silver)—0.5 [wt %] Cu(copper) composition having a melting point of approximately 230° C., for example.

The rewiring layer 39 is a layer for rearranging the electrode pads 6 having a wide arrangement pitch with respect to the electrode pads 32 of the semiconductor chip layer 38, wherein the electrode pads 6 of the rewiring layer 39 are arranged at the arrangement pitch equal to an arrangement pitch of connecting portions of the printed wiring board on which the semiconductor chip 4 is mounted.

The plurality of respective electrode pads 6 are, not limited specifically, arranged in a two row state along respective long sides at two long sides which face each other in an opposed manner on one main surface 4X of the semiconductor chip 4. The electrode pads 6 of each row are arranged at the arrangement pitch of approximately 0.5 mm, for example. A planer shape of the plurality of respective electrode pads 6 is formed in a circular shape having a diameter of approximately 0.25 mm, for example.

In the rewiring layer 39, to alleviate the concentration of stress generated by the difference of thermal expansion between the insulation layer 34 on the solder bumps 8, the insulation layer 36 and the printed wiring board after mounting the semiconductor chip 4 on the printed wiring board, the insulation layer 34 and the insulation layer 36 are respectively formed of a material which exhibits the low resiliency compared to the silicon nitride film or the silicon oxide film and, at the same time, are formed with a thickness larger than a thickness of the surface protective film 34. In this embodiment, the insulation layers 34 and 36 are formed of a polyimide-based resin, for example.

By forming lines exhibiting lower resistance, lower capacitance and lower impedance than the multilayered wiring layer 31 as the lines 35 which form the rewiring layer 39, the arrangement of the electrode pads can be determined with more freedom. Accordingly, the lines 35 are formed of a copper (Cu) film having the high conductivity, for example. Further, it is preferable that the lines 35 are formed of a conductive film having a large thickness compared to the electrode pads 32 which constitute portions of the multilayered wiring layer 31. Still further, it is preferable to use an organic insulation film having a low dielectric constant compared to an inorganic interlayer insulation film which is formed between the multilayer wiring layer 31 as the insulation film 36 which covers the lines 35. Although not limited specifically, to ensure the wettability at the time of forming the solder bumps 8, the electrode pads 6 are formed of a laminated film which is produced by sequentially stacking respective films consisting of a chromium (Cr) film, an alloy film having the composition of nickel (Ni)-copper (Cu) and a gold (Au) film.

As shown in FIG. 3 to FIG. 5, although not shown in detail in the drawings, on one main surface 2X of the printed wiring board 2, a plurality of lines 22, a plurality of lines 23 and the like are formed. The plurality of lines 22 and 23 are formed over an uppermost wiring layer of the soft layer 21. The plurality of lines 22 have connecting portions 22a which are respectively formed of portions of the lines 22, wherein the respective connecting portions 22a are exposed through openings formed in the protective film 24. The respective connecting portions 22a of the plurality of lines 22 are arranged in a state that the connecting portions 22a correspond to the plurality of electrode pads 5 of the semiconductor chip 3.

The plurality of lines 23 have connecting portions 23a which are respectively formed of portions of the lines 23, wherein the respective connecting portions 23a are exposed through openings formed in the protective film 26. The respective connecting portions 23a of the plurality of lines 23 are arranged in a state that the connecting portions 23a correspond to the plurality of electrode pads 6 of the semiconductor chip 4.

On another main surface (back face) of the printed wiring board 2 which faces one main surface 2X, the plurality of electrode pads 25 are formed. The electrode pads 25 are formed over the uppermost wiring layer of the soft layer 21B.

To the plurality of respective electrode pads 25, the plurality of solder bumps 11 which are arranged on the back face side of the printed wiring board 2 as external connection terminals are electrically and mechanically connected. The plurality of respective solder bumps 11 are formed of a metal member (Pb—Sn eutectic material) made of 37 [wt %] Pb(lead)—63 [wt %] Sn(tin) composition having a melting point of approximately 183° C., for example.

The semiconductor chip 3 is mounted in a state that one main surface 3X thereof faces one main surface 2X of the printed wiring board 2. An anisotropic conductive resin 9, for example, is interposed between the semiconductor chip 3 and the printed wiring board 2 as an adhesive resin and the semiconductor chip 3 is fixed to the printed wiring board 2 by adhesion using the anisotropic conductive resin 9. As the anisotropic conductive resin 9, for example, a material which is produced by mixing a large number of conductive particles in the inside of an epoxy-based thermosetting insulation resin is used.

The plurality of stud bumps 7 are arranged between the respective electrode pads 5 of the semiconductor chip 3 and the respective connecting portions 22a of the printed wiring board 2, wherein the respective pads 5 and the respective connecting portions 22a are electrically connected to each other. The stud bumps 7 are compression-bonded to the connecting portions 22a of the printed wiring board 22 by a thermo shrinking force (shrinking force which is generated when the resin returns to an ordinary temperature state from a heated state), a thermo setting shrinking force (shrinking force which is generated when the thermosetting resin is cured) and the like of the anisotropic conductive resin 9 which is interposed between the printed wiring board 2 and the semiconductor chips 3. Here, between the stud bumps 7 and the connecting portions 22a of the printed wiring board 2, a portion of the conductive particles which are mixed in the anisotropic conductive resin 9 in a large number is interposed.

Recessed portions which indent in the depth direction of the printed wiring board 2 are formed in the connecting portions 22a of the printed wiring board 2. In the inside of the recessed portions, the stud bumps 7 and the connecting portions 22a are connected. In this manner, by connecting the stud bumps 7 and the connecting portions 22a in the inside of the recessed portions, it is possible to reduce a volume of the anisotropic conductive resin 9 between one main surface 2X of the printed wiring board 2 and one main surface 3X of the semiconductor chip 3 by an amount corresponding to an indenting quantity of the recessed portions.

Through openings formed in the protective film 24, the stud bumps 7 are connected to the connecting portions 22a which are arranged at bottoms of the openings. That is, the stud bumps 7 extend in the depth direction from one main surface 2X of the printed wiring board 2 and are connected to the connecting portions 22a which are arranged at positions deeper than one main surface 2X. In this manner, by arranging the connecting portions 22a at the positions deeper than one main surface of the printed wiring board 2, it is possible to reduce a volume of the anisotropic conductive resin 9 between one main surface 2X of the printed wiring board 2 and one main surface 3X of the semiconductor chip 3 by an amount corresponding to the depth from one main surface 2X of the printed wiring board 2 to the connecting portions 22a.

The recessed portions of the connecting portions 22a are formed based on the resilient deformation of the connecting portion 22 and the soft layer 21. The recessed portions which are formed due to the resilient deformation of the connecting portion 22a and the soft layer 21 can be formed by compression bonding force at the time of mounting the semiconductor chip 3 to one main surface of the printed wiring board 2. When the recessed portions are formed due to the resilient deformation of the connecting portion 22a and the soft layer 21, a resilient force of the connecting portions 22a and the soft layer 21 acts on the stud bumps 7 and hence, a compression force between the stud bumps 7 and the connecting portions 22a is increased.

Further, even when a gap between one main surface 2X of the printed wiring board 2 and one main surface 3X of the semiconductor chip 3 is widened due to the expansion of the anisotropic conductive resin 9 in the thickness direction and the stud bumps 7 are moved upwardly correspondingly, the indenting amount of the recessed portions of the connecting portions 22a is changed due to the resilient restoring force of the soft layer 21 following the movement of the stud bumps 7 and hence, it is possible to ensure the connection between the connecting portions 22a of the printed wiring board 2 and the stud bumps 7.

The semiconductor chip 4 is mounted in a state that one main surface 4X thereof faces one main surface 2X of the printed wiring board 2. The plurality of solder bumps 8 are respectively arranged between the respective electrode pads 6 of the semiconductor chip 4 and the respective connecting portions 23a of the printed wiring board 2 so as to respectively electrically and mechanically connect the respective electrode pads 6 and the respective connecting portions 23a.

In a gap region defined between the semiconductor chip 4 and the printed wiring board 2, an underfill resin 10 made of an epoxy-based thermosetting insulation resin, for example, is filled (injected). In this manner, by filling the underfill resin 10 in the gap region defined between the semiconductor chip 4 and the printed wiring board 2, it is possible to compensate for the mechanical strength of the solder bumps 8 with the mechanical strength of the underfill resin 10 whereby it is possible to suppress the rupture of the solder bumps 8 caused by the difference in thermal expansion coefficient between the semiconductor chip 4 and the printed wiring board 2.

The plurality of stud bumps 7 are, as shown in FIG. 6, arranged along respective sides of one main surface 3X of the semiconductor chip 3. The arrangement pitch 7P of the stud bump 7 is set to approximately 85 [μm], for example. The plurality of solder bumps 8 are, as shown in FIG. 7, arranged in two rows along respective long sides at two long sides which face each other on one main surface 4X of the semiconductor chip 4. The arrangement pitch 8P of the semiconductor pumps 8 in each row is set to approximately 0.5 mm, for example.

Figure 9:
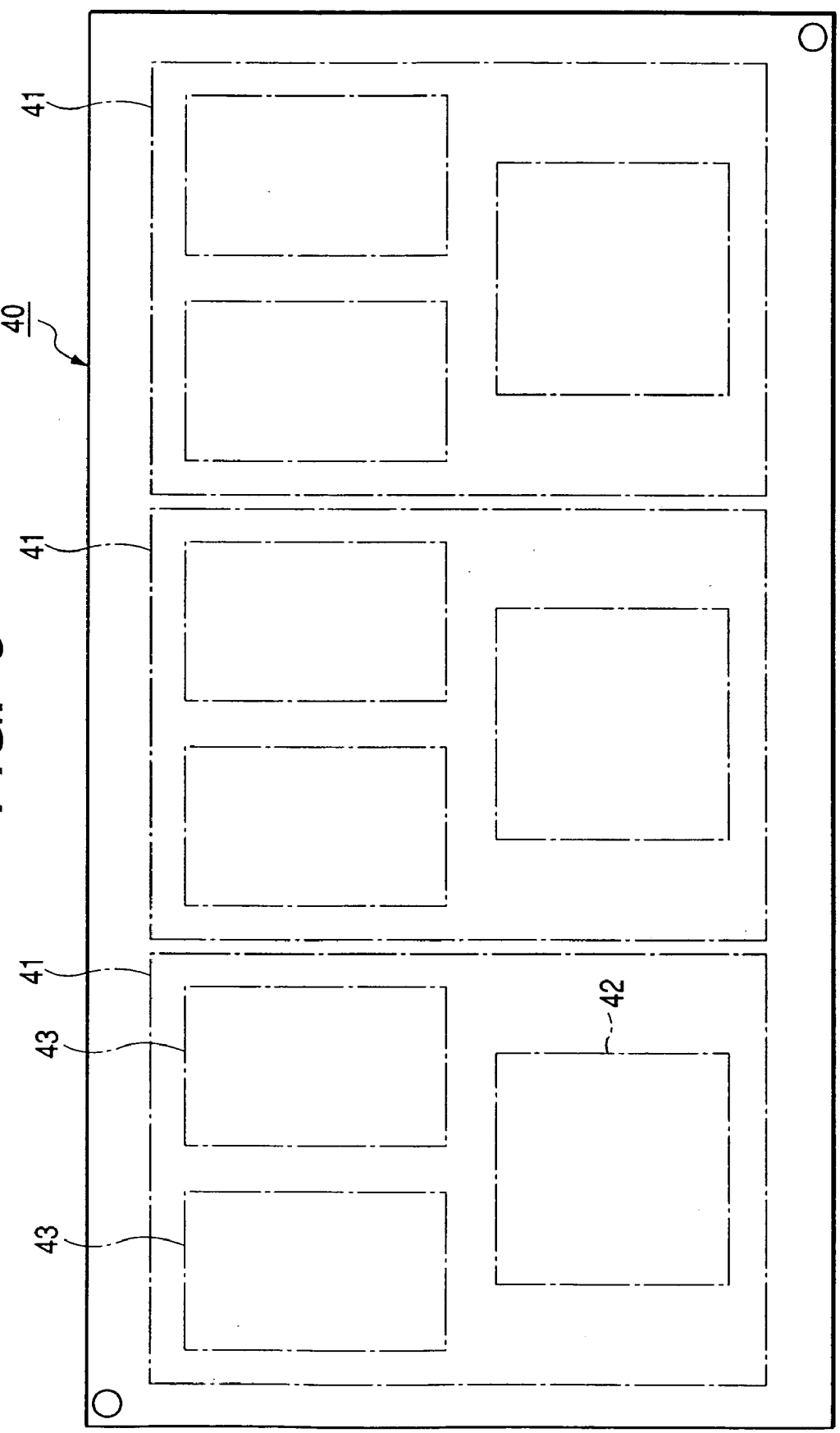
FIG. 9 is a plan view of a printed wiring board which can be obtained in a plural number at a time used in the manufacture of the MCM shown in FIG. 1.

Next, the printed wiring board for taking plural pieces which is used in the manufacture of MCM-1A is explained in conjunction with FIG. 9 (plan view).

As shown in FIG. 9, the printed wiring board 40 for taking plural pieces is configured to include a plurality of board forming regions (product forming regions) 41 which are arranged in the longitudinal direction at a given interval. In this embodiment, the printed wiring board 40 includes three board forming regions 41, for example. In each board forming region 41, one chip mounting region 42 and two chip mounting regions 43 are provided. A semiconductor chip (stud-bump connection semiconductor chip) 3 is mounted on the chip mounting region 42 and semiconductor chips (solder-bump connection semiconductor chips) 4 are mounted on the chip mounting region 43.

Respective board forming regions 41 have peripheries thereof surrounded by a separation region and hence, the board forming regions 41 are spaced apart from each other. By cutting the separation region of the printed wiring board 40 for taking plural pieces using a cutting tool which is called a bit, for example, the board forming regions 41 are cut out to form the above-mentioned printed wiring boards 2. The board forming region 41 has the same constitution as the printed wiring board 2.

Next, the manufacture of the MCM-1A is explained in conjunction with FIG. 10 to FIG. 14. FIG. 10 to FIG. 14 are cross-sectional views of an essential part for explaining the manufacture of the MCM-1A ((a) being the cross-sectional view taken along a line A—A in FIG. 1 and (b) being the cross-sectional view taken along a line B—B in FIG. 1).

First of all, the printed wiring board 40 for taking plural pieces shown in FIG. 9 is prepared and, at the same time, the semiconductor chips (stud-bump connection semiconductor chips) 3 shown in FIG. 6 and the semiconductor chips (solder-bump connection semiconductor chips) 4 shown in FIG. 7 are prepared.

Figure 10:
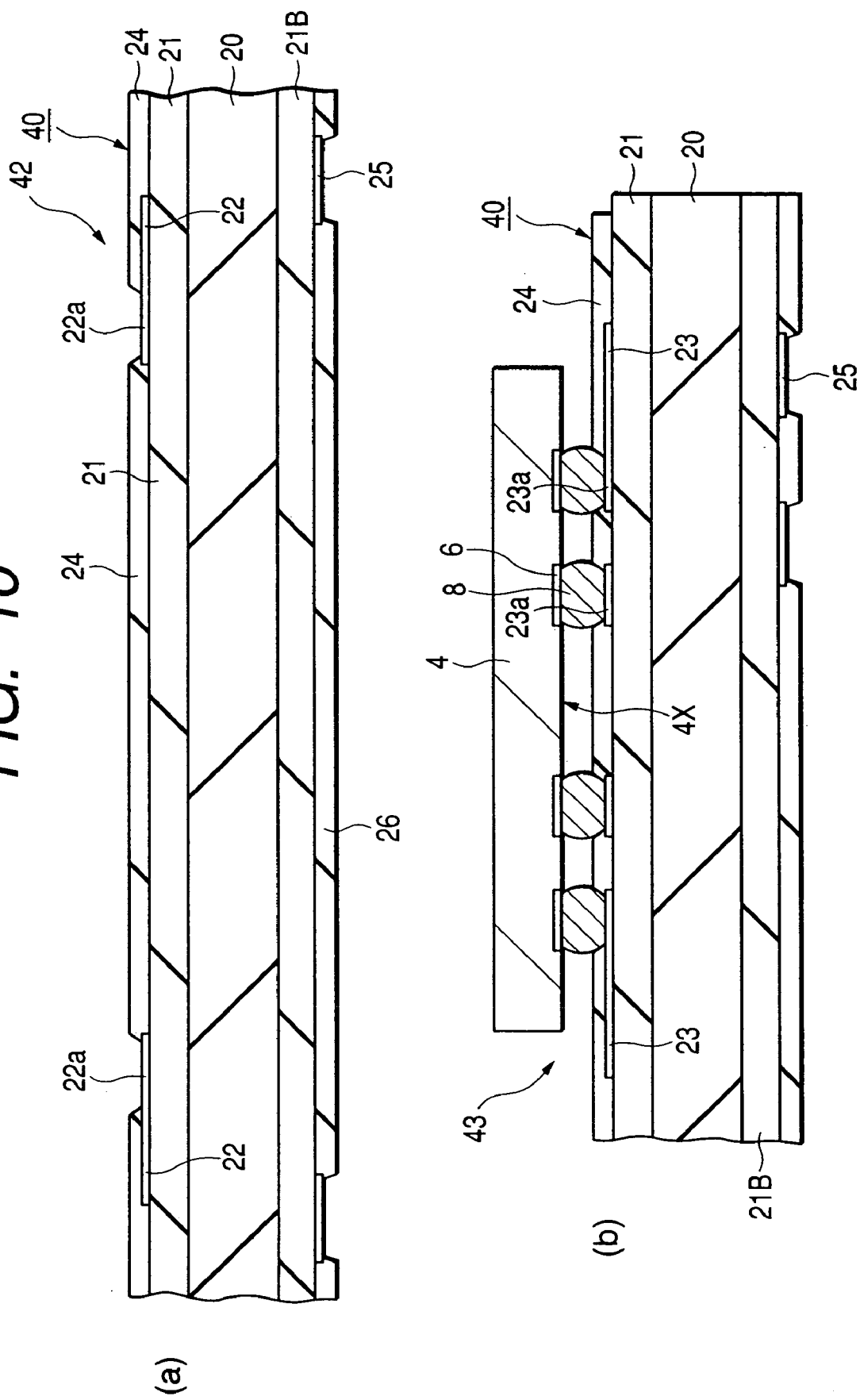
FIG. 10 is a cross-sectional view of an essential part for explaining the manufacture of the MCM shown in FIG. 1 ((a) being a cross-sectional view taken at a position along a line A—A in FIG. 1, (b) being a cross-sectional view taken at a position along a line B—B in FIG. 1).

Next, as shown in FIG. 10, before mounting the semiconductor chips 4, the semiconductor chips 4 are collectively mounted on the respective chip mounting regions 43 of the plurality of board forming regions 41 on one main surface of the printed wiring board 40. Mounting of the semiconductor chips 4 are performed such that a flux is supplied to the connecting portions 23a arranged on the chip mounting regions 43 by a screen printing method, for example, and, thereafter, the semiconductor chips 4 are arranged on the respective chip mounting regions 43 of the plurality of board forming regions 41 such that the solder bumps 8 are positioned on the connecting portions 23a and, thereafter, the printed wiring board 40 is transferred to an infrared reflow furnace, for example, to melt the solder bumps 8 and, thereafter, the melted solder bumps 8 are solidified. The solder bumps 8 of this embodiment are formed of a metal material of Sn—1% Ag—0.5% Cu composition having the melting point of approximately 230° C. and hence, melting of the solder bumps 8 is performed under the reflow temperature condition in which a package surface temperature (board surface temperature) is set to approximately 260° C. The flux contains rosin, an activator, an organic solvent and the like.

Figure 11:
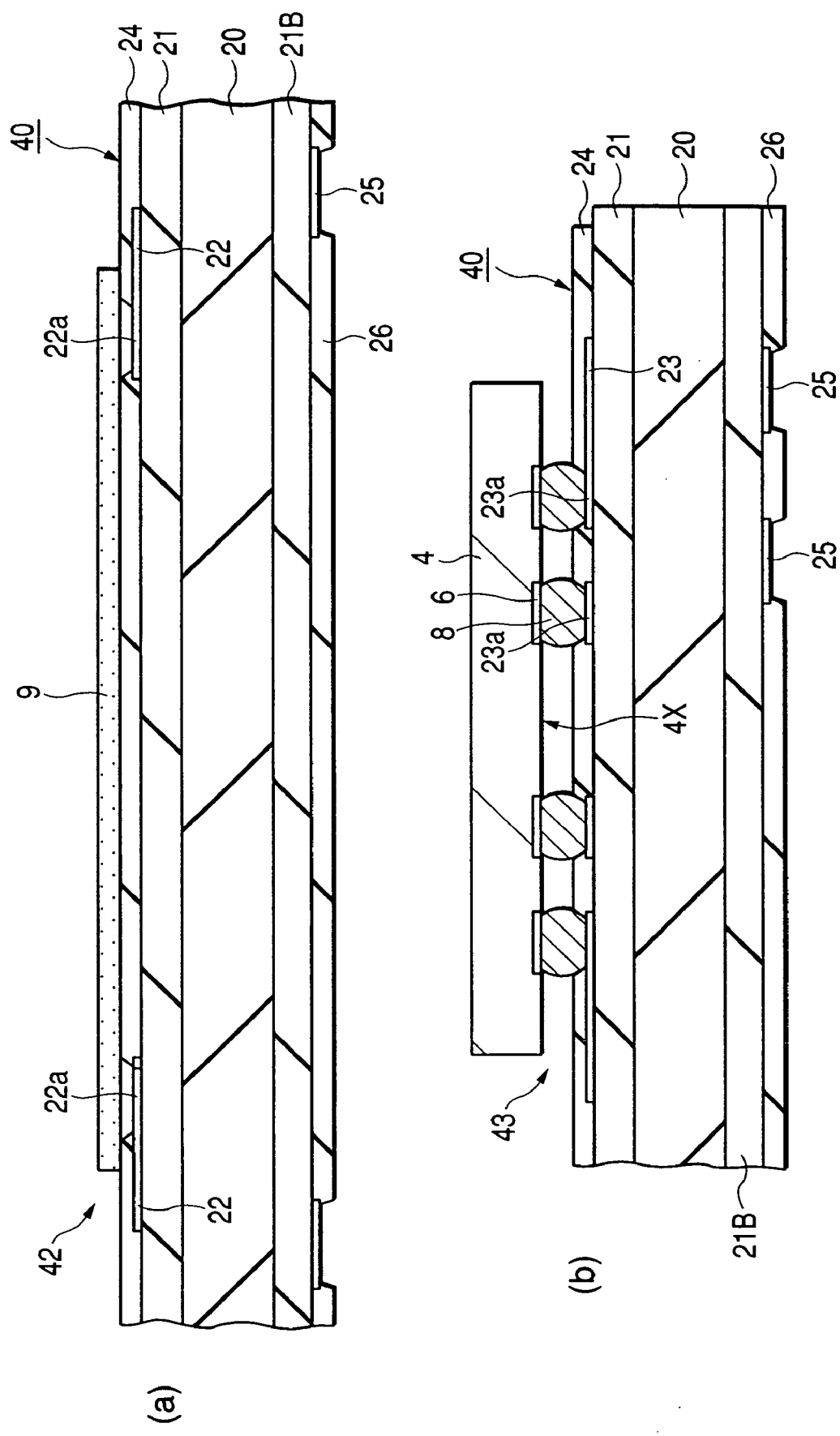
FIG. 11 is a cross-sectional view of an essential part for explaining the manufacture of the MCM shown in FIG. 1 ((a) being a cross-sectional view taken at a position along a line A—A in FIG. 1, (b) being a cross-sectional view taken at a position along a line B—B in FIG. 1).

Next, as shown in FIG. 11, to the chip mounting regions 42 of the board forming regions 41 on one main surface of the printed wiring board 40, as an adhesive resin, the anisotropic conductive resin 9 which is formed into a film shape (sheet shape) is laminated. As the anisotropic conductive resin 9, for example, a material which is produced by mixing a large number of conductive particles in an epoxy-based thermosetting insulation resin is used. Further, as the anisotropic conductive resin 9, such a resin having a thermosetting temperature of approximately 160° C. is used.

Figure 12:
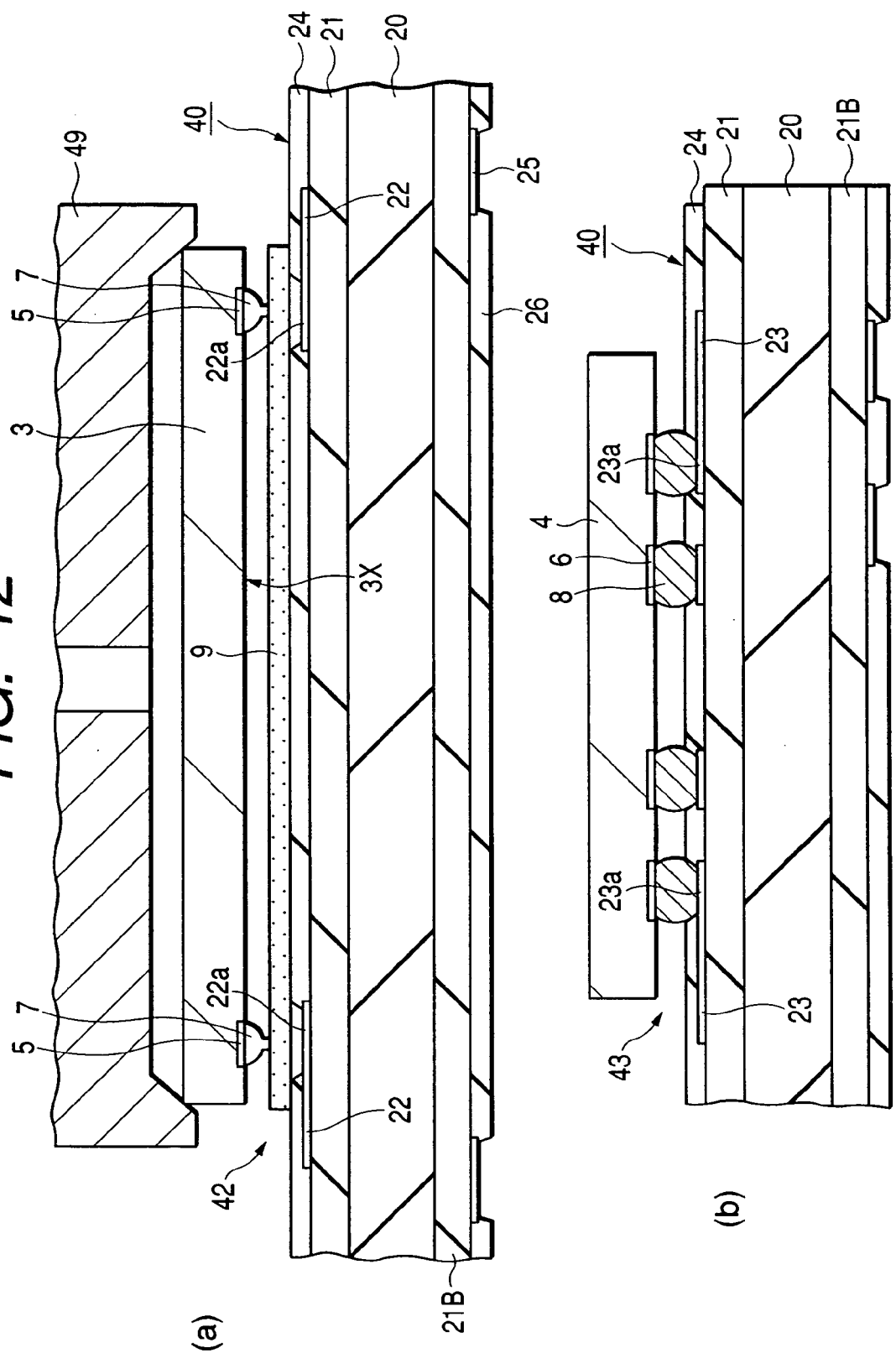
FIG. 12 is a cross-sectional view of an essential part for explaining the manufacture of the MCM shown in FIG. 1 ((a) being a cross-sectional view taken at a position along a line A—A in FIG. 1, (b) being a cross-sectional view taken at a position along a line B—B in FIG. 1).

Next, as shown in FIG. 12, on the chip mounting regions 42 of the board forming regions 41 on one main surface of the printed wiring board 40, the semiconductor chips 3 are arranged by way of the anisotropic conductive resin 9 using collets 49. The semiconductor chips 3 are arranged such that the stud pumps 7 are positioned above the connecting portions 22a. Further, the arrangement of the semiconductor chips 3 is, although not shown in FIG. 12, performed in a state that the printed wiring board 40 is arranged on a heat stage 51 shown in FIG. 13.

Next, as shown in FIG. 13, the printed wiring board 40 is heated by the heat stage 51, the semiconductor chip 3 is compression-bonded by a compression bonding tool 50 while being heated by the compression bonding tool 50 thus connecting the stud bumps 7 to the connecting portions 22a of the printed wiring board 40. Thereafter, the compression-bonding state is held until the anisotropic conductive resin 9 is cured. At this point of time, the stud bumps 7 are brought into pressure contact with the connecting portions 22a. Curing of the anisotropic conductive resin 9 is performed under the condition of 180° C. for 20 seconds. Heating at this point of time is performed such that the temperature of the printed wiring board 40 is preliminarily raised to approximately 65° C. and, thereafter, the heating is performed using the compression-bonding tool 50 which is heated up to 235° C.

The lamination of the anisotropic conductive resin 9, the arrangement of the semiconductor chip 3 by the collet 9 and the compression bonding of the semiconductor chip 3 by the compression-bonding tool 50 constitute one cycle and this one cycle is repeatedly performed for every substrate forming region 41.

In this step, by making a depth from one main surface of the printed wiring board 40 to the connecting portion 22a smaller than a height of the stud bumps 7, recessed portions are formed in the portions of the connecting portions 22a to which the stud bumps 7a are connected by the compression bonding of the semiconductor chip 3. Further, in the inside of the recessed portion, the connecting portion 22a of the printed wiring board 40 and the stud bump 7 are connected. Further, since the recessed portion is formed by the resilient deformation of the connecting portion 22a and the soft layer 21, the resilient force of the connecting portion 22a and the soft layer 21 acts on the stud bump 7.

Here, when the semiconductor chip (stud-bump connection semiconductor chip) 3 is mounted prior to mounting of the semiconductor chip (solder-bump connection semiconductor chip) 4, at the time of mounting the semiconductor chip 4, heat which is higher than the curing temperature of the anisotropic conductive film 9 is applied to the anisotropic conductive film 9 and hence, the bonding of the anisotropic conductive resin 9 is broken and cracks are liable to occur in the anisotropic conductive resin 9. However, according to this embodiment, by mounting the semiconductor chip 4 prior to mounting of the semiconductor chip 3, it is possible to prevent the heat generated at the time of mounting the semiconductor chip 4 from being applied to the anisotropic conductive resin 9 and hence, the cracks which occur in the anisotropic conductive resin 9 attributed to the bonding rupture in the inside of the resin can be suppressed.

Figure 14:
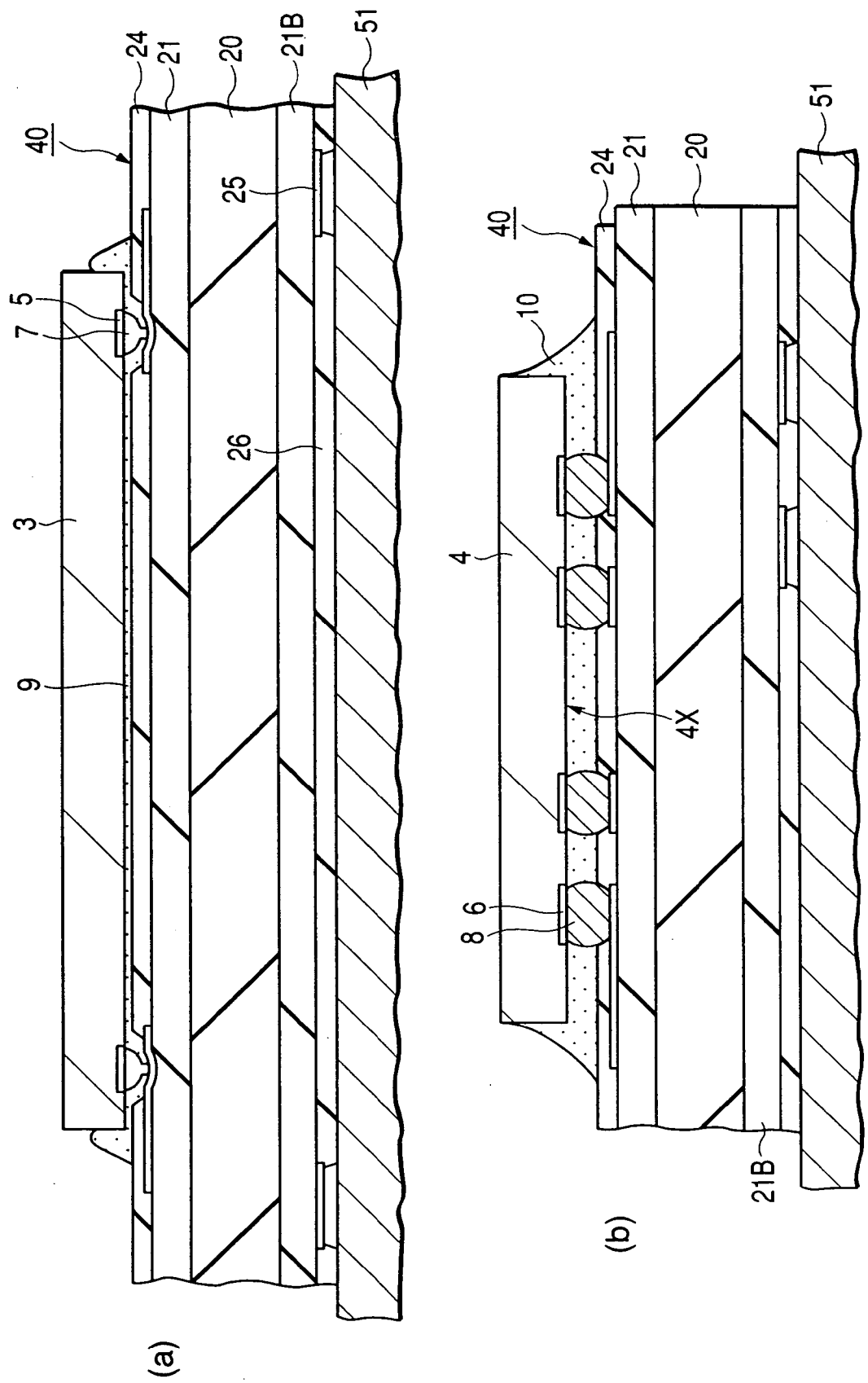
FIG. 14 is a cross-sectional view of an essential part for explaining the manufacture of the MCM shown in FIG. 1 ((a) being a cross-sectional view taken at a position along a line A—A in FIG. 1, (b) being a cross-sectional view taken at a position along a line B—B in FIG. 1).

Next, as shown in FIG. 14, an underfill resin 10 in a liquid form made of an epoxy-based thermosetting insulation resin, for example, is filled in a gap region defined between a chip mounting region 43 of one main surface of the printed wiring board 40 and the semiconductor chip 4 and, thereafter, is heated to be cured. Curing of the underfill resin 10 is performed under the condition of an ambient temperature of 160° C. for two hours. As the underfill resin 10, a resin which exhibits the thermosetting temperature of approximately 120° C., for example, is used.

Here, although the heat generated when the underfill resin 10 is cured is applied to the anisotropic conductive resin 9, the temperature at this point of time is substantially equal to the curing temperature of the anisotropic conductive resin 9 and hence, there is no possibility that the anisotropic conductive resin 9 suffers from the bonding rupture.

Here, when the underfill resin 10 is filled after mounting the semiconductor chip 4 and before mounting the semiconductor chip 3, due to spreading of wetting of the underfill resin 10, there exists a possibility that the connecting portion 22a of the chip mounting region 42 is covered with the underfill resin 10 and hence, it is necessary to widen the distance between the chip mounting regions 42, 43. However, by filling the underfill resin 10 after mounting the semiconductor chip 3 as in the case of this embodiment, there is no possibility that the connecting portion 22a of the chip mounting region 42 is covered due to spreading of wetting of the underfill resin 10 and hence, it is possible to narrow the distance between the chip mounting regions 42 and 43.

Next, ball-shaped solder bumps 11 are supplied to positions above the electrode pads 25 which are arranged on a back surface of the printed wiring board 40 by a ball supply method, for example, and, thereafter, the solder bumps 11 are melted so as to electrically and mechanically connect the electrode pads 25 and the solder bumps 11. Since the solder bumps 11 of this embodiment are formed of a metal material of Pb—Sn composition having a melting point of approximately 183° C., melting of the solder bumps 11 is performed under the reflow temperature condition in which the package surface temperature is set to approximately 230° C.

Here, although the heat is applied to the anisotropic conductive resin 9 when the solder bumps 11 are melted, the heat treatment at this point of time is performed at a low temperature and for a short time compared to the heat treatment performed at the time of mounting the semiconductor chip 4 and hence, the possibility that such heat influences the rupture of bonding of the anisotropic conductive resin 9 is relatively small.

Next, the board forming regions 41 are cut out by cutting the separation region of the printed wiring board 40 for taking plural pieces using a cutting tool thus forming the printed wiring boards 2. In this state, the MCA-1A is also almost completed. Although the explanation is made with respect to the example in which the board forming regions 41 are cut out after forming the solder bumps 11 in this embodiment, the formation of the solder bumps 11 may be performed after cutting out the board forming regions 41.

In this manner, according to the present invention, it is possible to obtain following advantageous effects.

(1) In the manufacture of the MCA-1A which mounts the semiconductor chip (stud-bump connection semiconductor chip) 3 and the semiconductor chips (solder-bump connection semiconductor chips) 4 in a mixed form on the same printed wiring board 2, the semiconductor chip 3 is mounted after mounting the semiconductor chips 4. Accordingly, it is possible to prevent the heat generated at the time of mounting the semiconductor chip 4 from being applied to the anisotropic conductive resin 9 and hence, it is possible to suppress the occurrence of cracks in the anisotropic conductive resin 9 attributed to the rupture of bonding inside the resin. As a result, lowering of the shrinking force of the anisotropic conductive resin 9 can be suppressed and hence, the connection failure between the stud bumps 7 and the connecting portions 22a of the printed wiring board 2 can be suppressed whereby the reliability of the MCA-1A can be enhanced.

Further, it is possible to mount the semiconductor chip 3 and the semiconductor chips 4 on the same printed wiring board 2 in a mixed form while ensuring the reliability of connection due to the anisotropic conductive resin 9.

(2) In the manufacture of the MCM-1A, after mounting the semiconductor chip 4, the underfill resin 10 is filled in the gap region defined between the printed wiring board 40 and the semiconductor chip 3. Due to such a constitution, there is no possibility that the connecting portion 22a of the chip mounting region 42 is covered due to spreading of wetting of the underfill resin 10 and hence, it is possible to narrow the distance between the chip mounting regions 42 and 43. As a result, the MCM-1A can be miniaturized.

Here, the explanation is made with respect to the example in which the thermosetting insulation resin is used as the underfill resin 10 in this embodiment, an ultraviolet ray curing insulation resin may be used as the underfill resin 10. In this case, the underfill resin 10 can be cured without applying heat to the anisotropic conductive resin 9 and hence, the reliability of the MCM-1A can be further enhanced.

Further, although the explanation is made with respect to the example in which the anisotropic conductive resin 9 in a film shape is used as the adhesive resin in this embodiment, for example, an insulation resin film in which no conductive particles are mixed (NCF), an anisotropic conductive resin in a paste form (ACP) or the like may be used as the adhesive resin.

Further, the explanation is made with respect to the example in which the solder bumps which are made of the metal material (PB-free material) having the Sn—1% Ag—0.5% Cu composition is used as the solder bumps 8 in this embodiment, the solder bumps 8 may be formed of a metal material having the same composition as the solder bumps 11.

(Embodiment 2)

Figure 15:
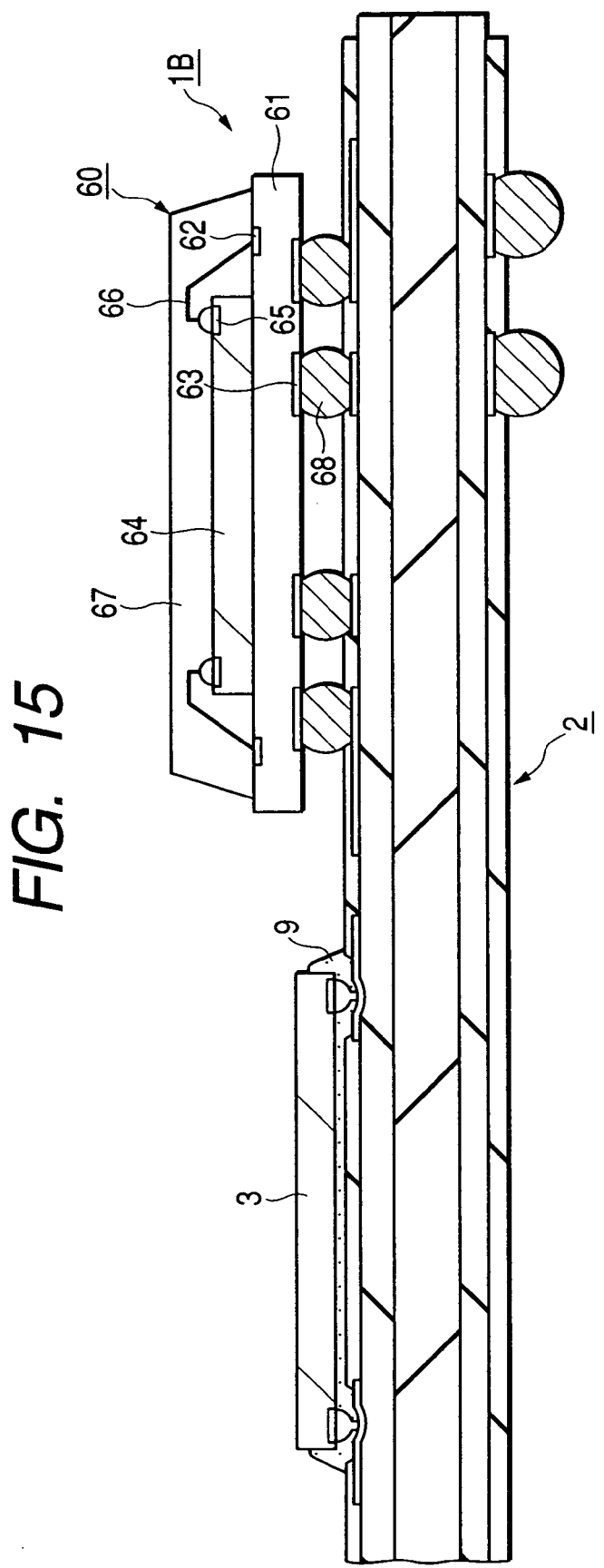
FIG. 15 is a cross-sectional view of an essential part of an MCM which constitutes an embodiment 2 of the present invention.

FIG. 15 is a cross-sectional view of an essential part of an MCM according to the second embodiment of the present invention.

As shown in FIG. 15, the MCM-1B of this embodiment substantially has the same constitution as the MCM of the above-mentioned embodiment 1 and differs from the MCM of the above-mentioned embodiment 1 with respect to following constitutions.

That is, in place of the semiconductor chips (solder-bump connection semiconductor chips) 4, CSP-type semiconductor devices 60 each of which packages a semiconductor chip are mounted on the printed wiring board 2.

The CSP-type semiconductor device 60 is configured to include a printed wiring board 61, a semiconductor chip 64 which is arranged on one main surface side of the printed wiring board 61, bonding wires 66 which electrically connect electrode pads 65 arranged on one main surface of the semiconductor chip and electrode pads 62 arranged on one main surface of the printed wiring board 61, a resin sealing body 67 which seals the semiconductor chip 64 and the bonding wires 66, and a plurality of solder bumps 68 which are arranged as projection electrodes on another main surface (back surface) side which faces one main surface of the printed wiring board 61. The CSP-type semiconductor device 60 is mounted on the printed wiring board 2 by melting the solder bumps 68 in the same manner as the semiconductor chips 4.

Also in the MCM-1B having such a constitution, by mounting the CSP-type semiconductor device 60 in advance before mounting the semiconductor chip (stud-bump connection semiconductor chip) 3, it is possible to obtain advantageous effects similar to those of the previous embodiments.

(Embodiment 3)

Figure 16:
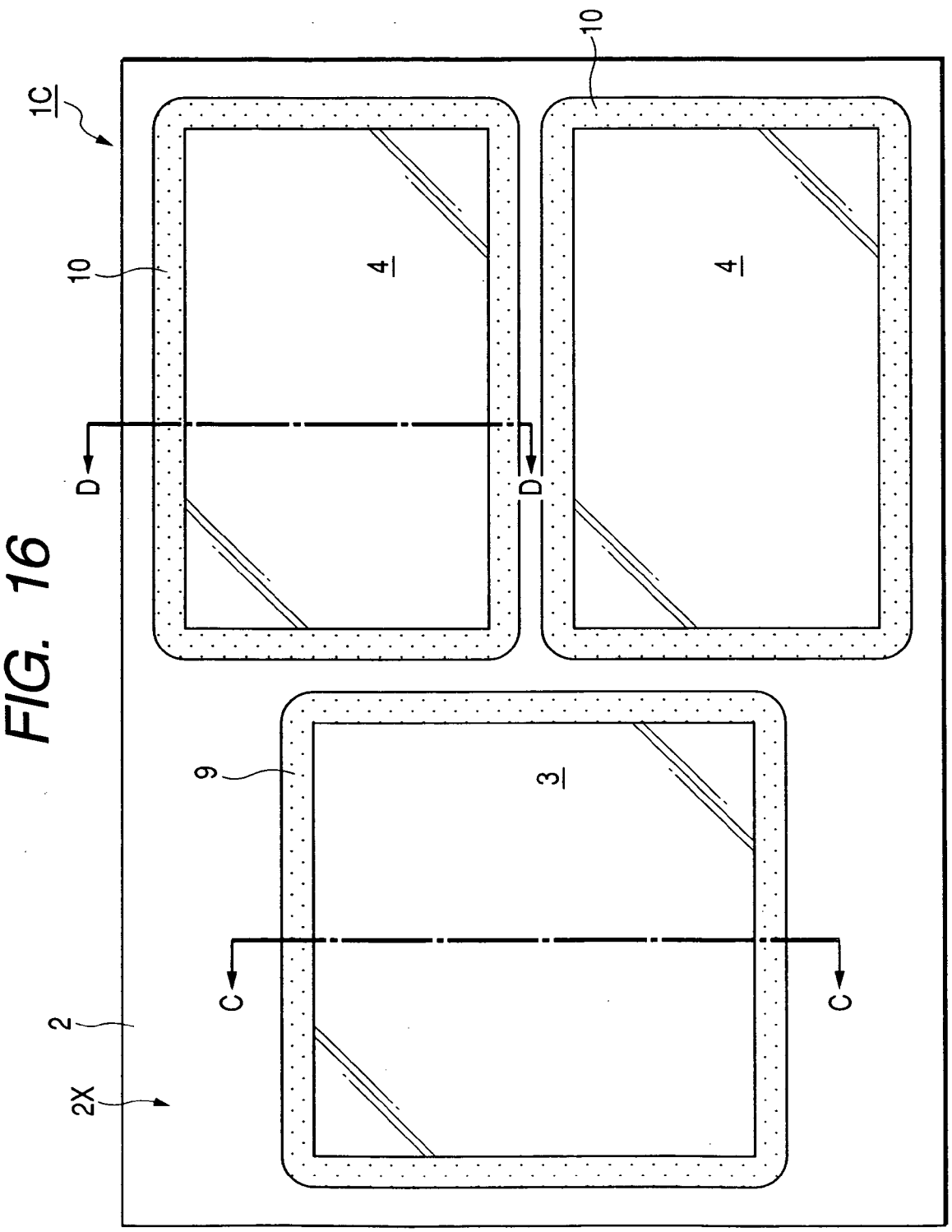
FIG. 16 is a plan view of an MCM which constitutes an embodiment 3 of the present invention.
Figure 17:
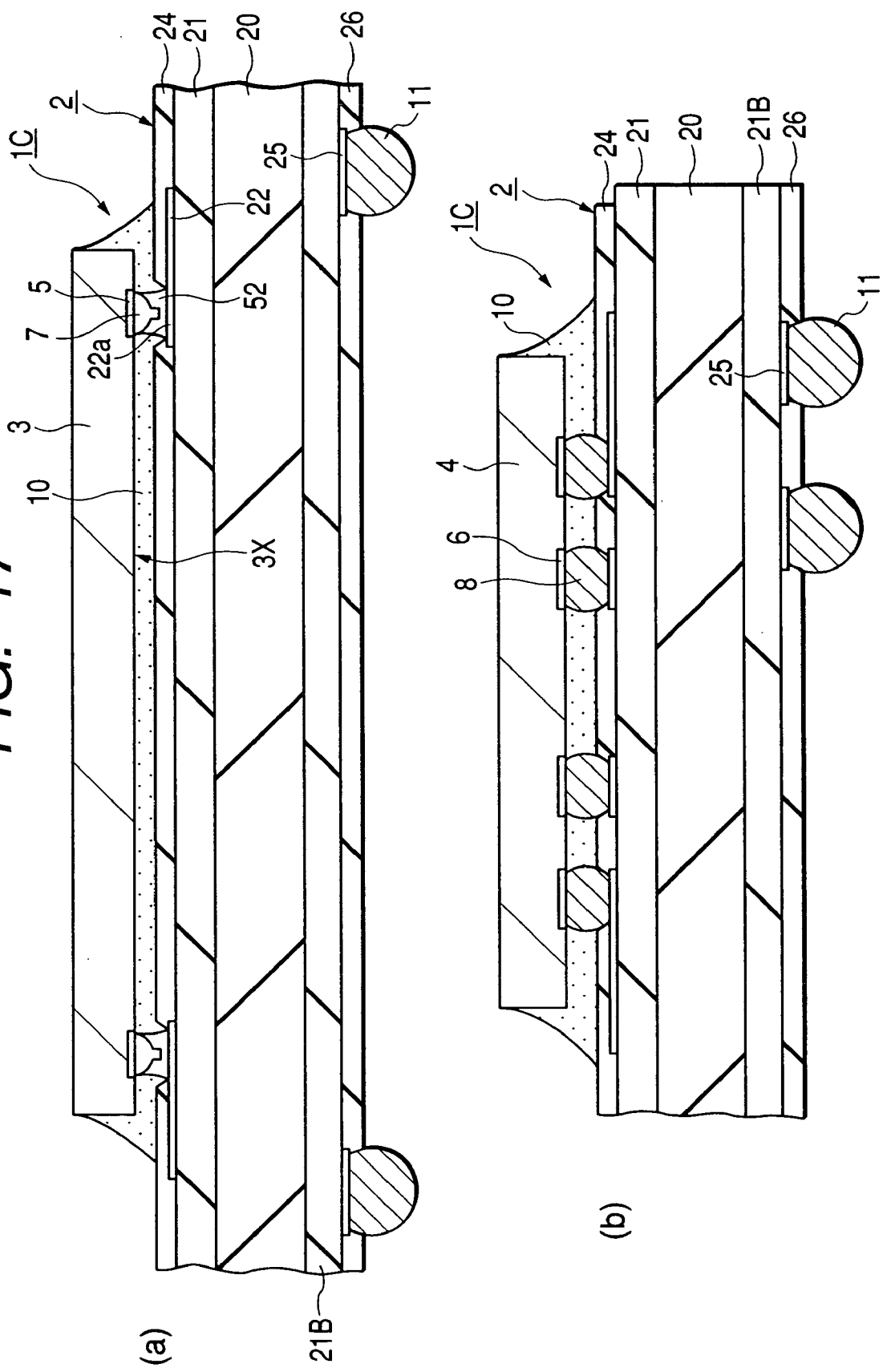
FIG. 17 is a cross-sectional view of an essential part of the MCM shown in FIG. 16 ((a) being a cross-sectional view taken along a line C—C in FIG. 16, (b) being a cross-sectional view taken along a line D—D in FIG. 16).

FIG. 16 is a plan view of an MCM which constitutes an embodiment 3 of the present invention. FIG. 17 is a cross-sectional view of an essential part of the MCM shown in FIG. 16 ((a) being a cross-sectional view taken along a line C—C in FIG. 16, (b) being a cross-sectional view taken along a line D—D in FIG. 16).

As shown in FIG. 16 and FIG. 17, the MCM-1C of this embodiment has substantially the same constitution as the MCM of the above-mentioned embodiment 1 and differs from the MCM of the above-mentioned embodiment 1 with respect to following constitutions.

That is, the stud bump 7 is electrically and mechanically connected to the connecting portion 22*a* of the printed wiring board 2 by way of a bonding material 52. Further, in a gap region defined between the semiconductor chip (stud-bump connection semiconductor chip) 3 and the printed wiring board 2, to suppress the rupture of the semiconductor chip 3 caused by the concentration of the thermal stress attributed to the difference in thermal expansion coefficient between the printed wiring board 2 and the semiconductor chip 3, the underfill resin 10 is filled in the same manner as the semiconductor chip (solder-bump connection semiconductor chip) 4. Hereinafter, the manufacture of the MCM-1C is explained in conjunction with FIG. 18 to FIG. 23. FIG. 18 to FIG. 23 are cross-sectional views of an essential part for explaining the manufacture of the MCM-1C ((a) being a cross-sectional view taken at a position along a line C—C in FIG. 16, (b) being a cross-sectional view taken at a position along a line C—C in FIG. 16).

First of all, the printed wiring board 40 for taking plural pieces shown in FIG. 9 is prepared and, at the same time, the semiconductor chip (stud-bump connection semiconductor chip) 3 shown in FIG. 6 and the semiconductor chips (solder-bump connection semiconductor chip) 4 shown in FIG. 7 are prepared.

Figure 18:
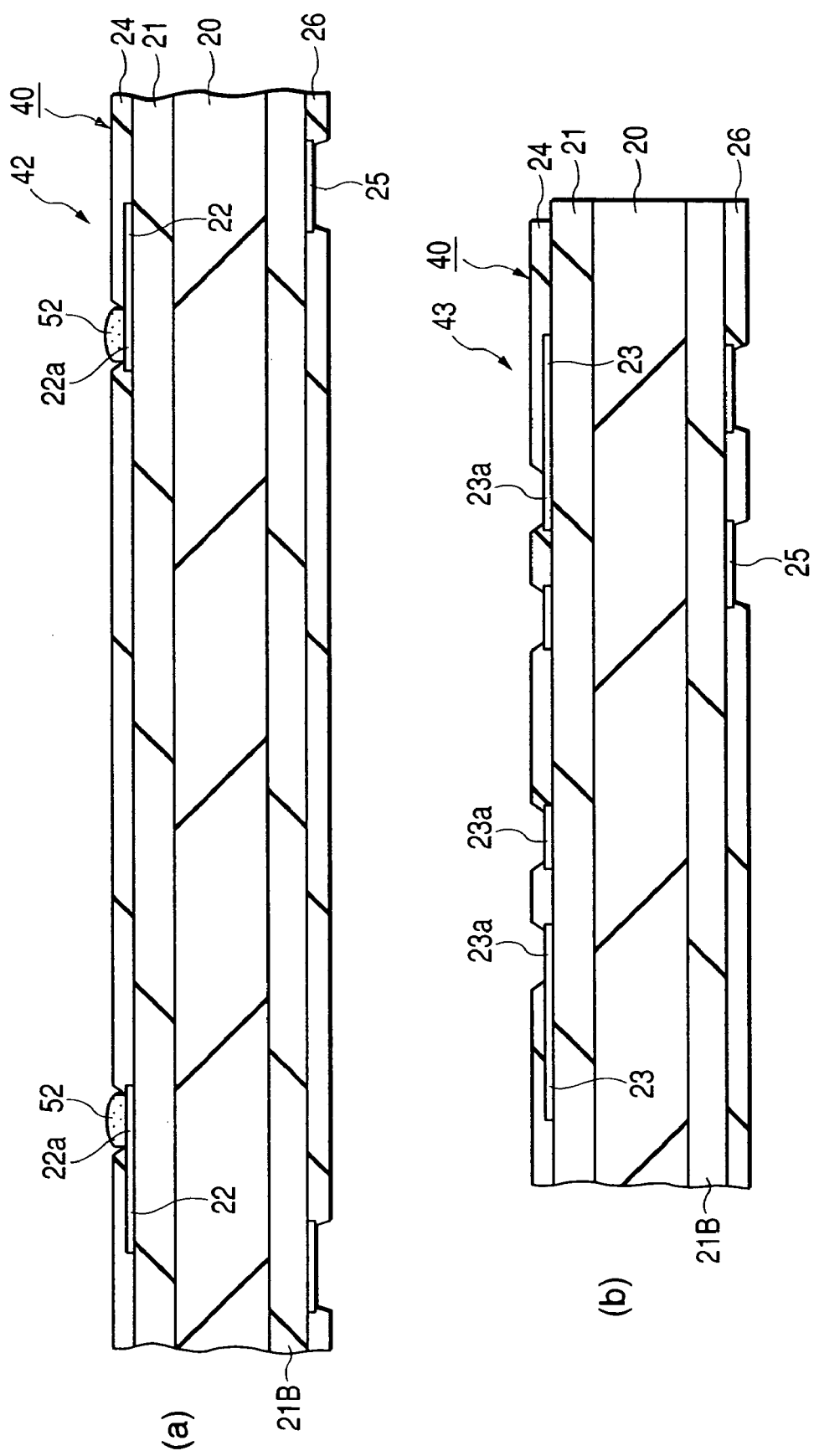
FIG. 18 is a cross-sectional view of an essential part for explaining the manufacture of the MCM shown in FIG. 16 ((a) being a cross-sectional view taken at a position along a line C—C in FIG. 16, (b) being a cross-sectional view taken at a position along a line D—D in FIG. 16).

Next, as shown in FIG. 18, using a dispense method, for example, bonding material 52 in a paste form is supplied onto the connecting portions 22*a* arranged on respective chip mounting regions 42 of the plurality of board forming regions 41 formed over one main surface of the printed wiring board 40. As the bonding material 52, a solder paste material having a melting point which is lower than a melting point of the stud bumps 7 of the semiconductor chip 3 and higher than a melting point of the solder bumps 8 of the semiconductor chip 4 is used. As the solder paste material, a solder paste material which mixes at least minute solder particles and flux therein is used. In this embodiment, the solder paste material which mixes solder particles of 98 [wt %]Pb(lead)—2 [wt %]Sn(tin) composition having a melting point of approximately 300° C., for example, therein is used. The stud bumps 7 and the solder bumps 8 of this embodiment are formed of the substantially same material as those of the previously-mentioned embodiment 1. The dispense method is a method which projects the solder paste material from a narrow nozzle and applies the solder paste material.

Figure 19:
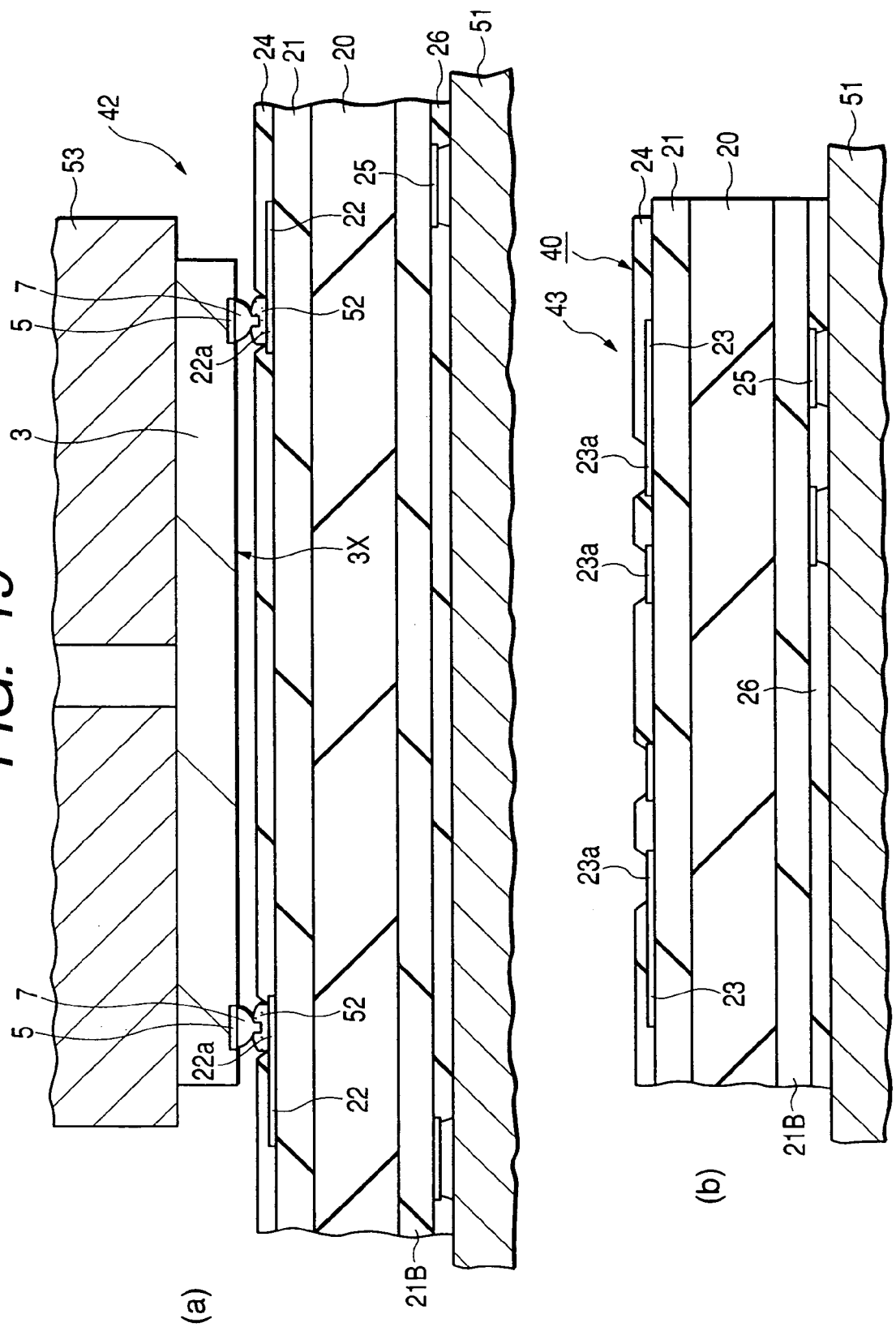
FIG. 19 is a cross-sectional view of an essential part for explaining the manufacture of the MCM shown in FIG. 16 ((a) being a cross-sectional view taken at a position along a line C—C in FIG. 16, (b) being a cross-sectional view taken at a position along a line D—D in FIG. 16).
Figure 20:
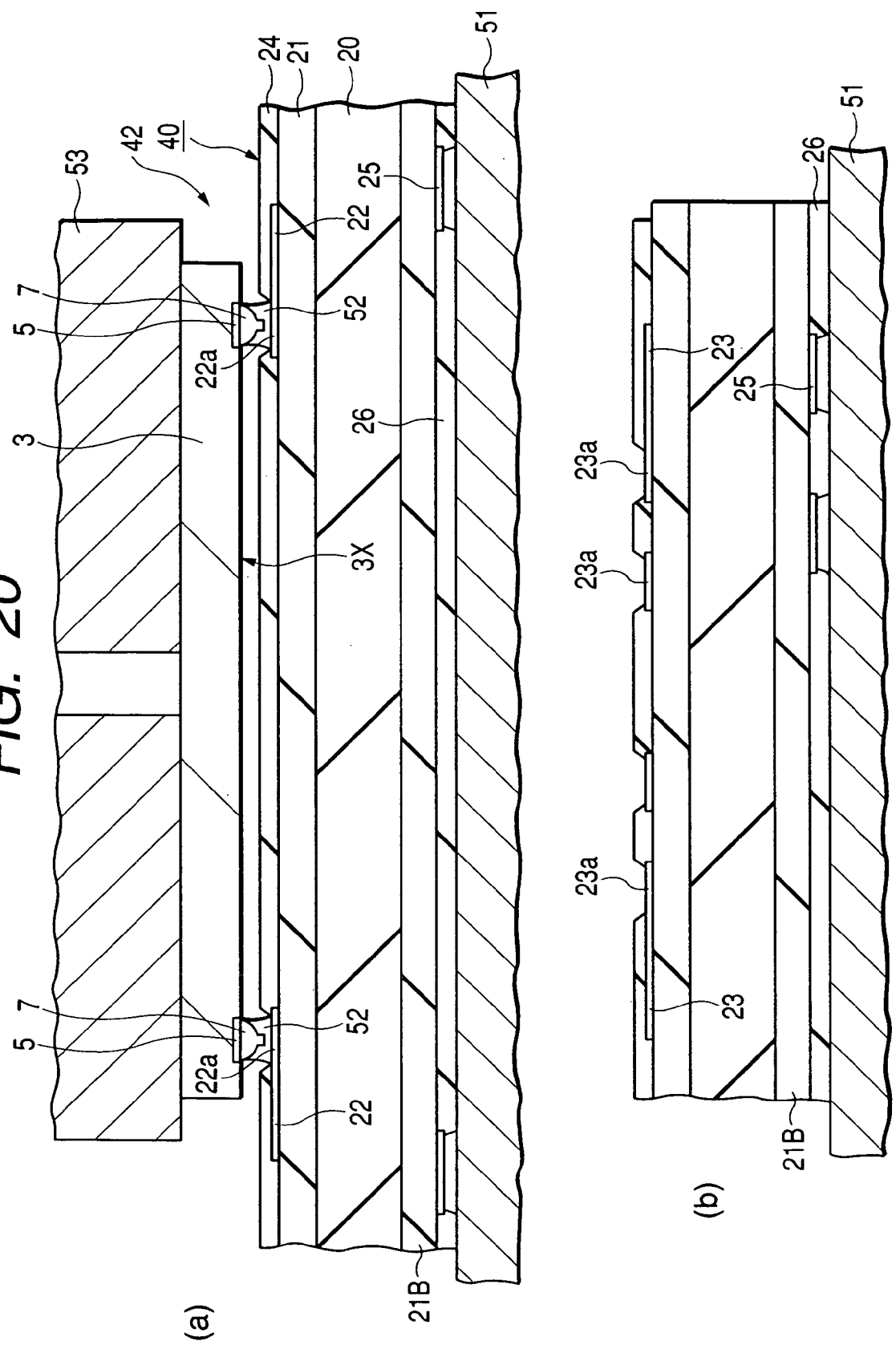
FIG. 20 is a cross-sectional view of an essential part for explaining the manufacture of the MCM shown in FIG. 16 ((a) being a cross-sectional view taken at a position along a line C—C in FIG. 16, (b) being a cross-sectional view taken at a position along a line D—D in FIG. 16).

Next, as shown in FIG. 19, the printed wiring board 40 is arranged on the heat stage 51 and, thereafter, the semiconductor chip 3 is conveyed to a position above the chip mounting region 42 such that the stud bumps 7 are positioned above the connecting portions 22*a* by a collet 53. Then, the printed wiring board 40 is heated by a heat stage 51 and the semiconductor chip 3 is heated by the collet 53 so as to melt the bonding material 52 as shown in FIG. 20. Thereafter, the melted bonding material 52 is solidified. Accordingly, the semiconductor chip 3 is mounted on the chip mounting region 42 on one main surface of the printed wiring board 40. This mounting of the semiconductor chip 3 is performed for respective chip mounting regions 42 of the plurality of board forming regions 40 provided to one main surface of the printed wiring board 40.

Figure 21:
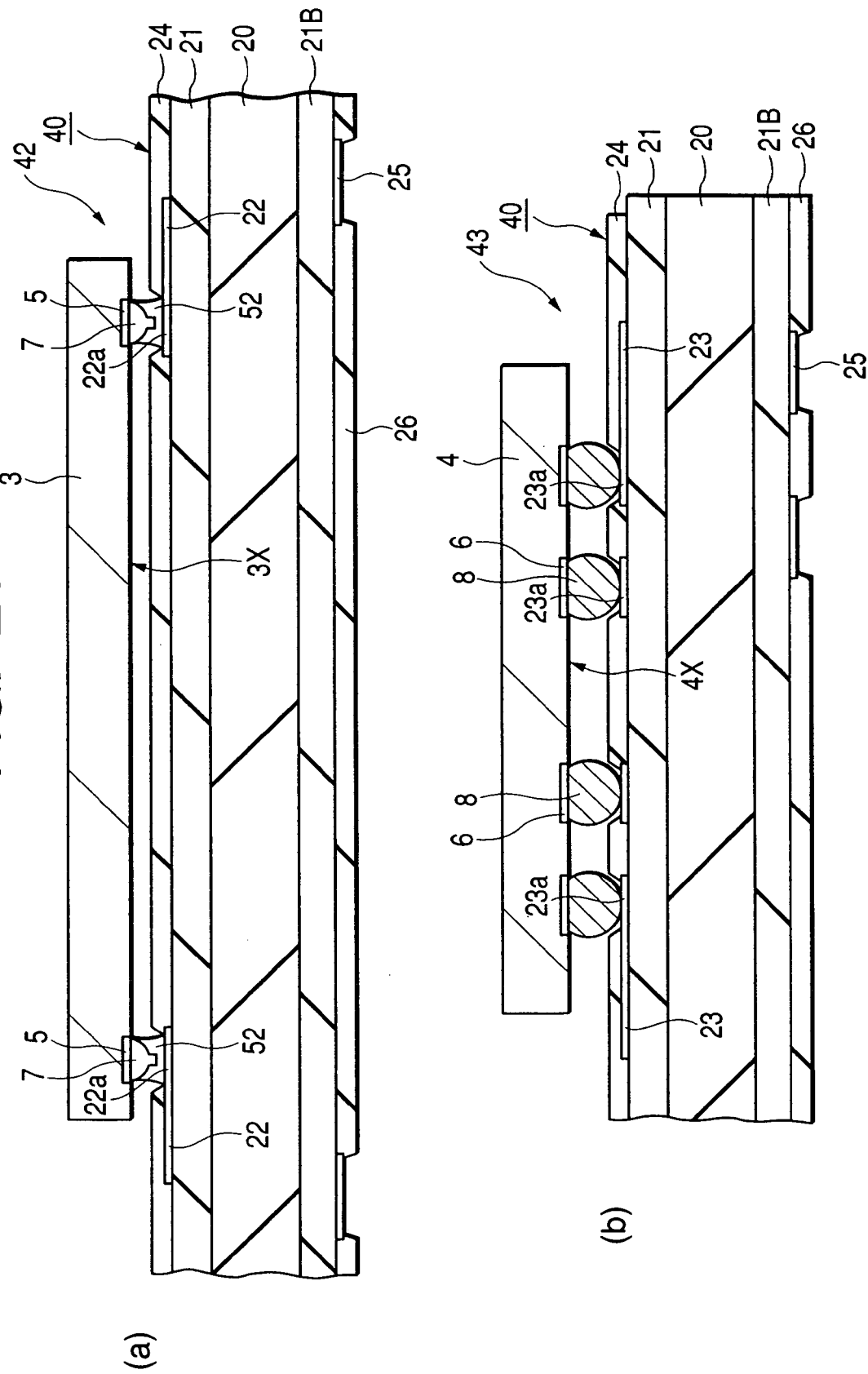
FIG. 21 is a cross-sectional view of an essential part for explaining the manufacture of the MCM shown in FIG. 16 ((a) being a cross-sectional view taken at a position along a line C—C in FIG. 16, (b) being a cross-sectional view taken at a position along a line D—D in FIG. 16).

Next, to connecting portions 23*a* arranged on respective chip mounting regions 43 of the plurality of board forming regions 41 on one main surface of the printed wiring board 40, flux is supplied by a screen printing method, for example. Thereafter, as shown in FIG. 21, the semiconductor chips 4 are arranged on the respective chip mounting regions 43 of the plurality of board forming regions 41 such that the solder bumps 8 are positioned on the connecting portions 23*a*.

Figure 22:
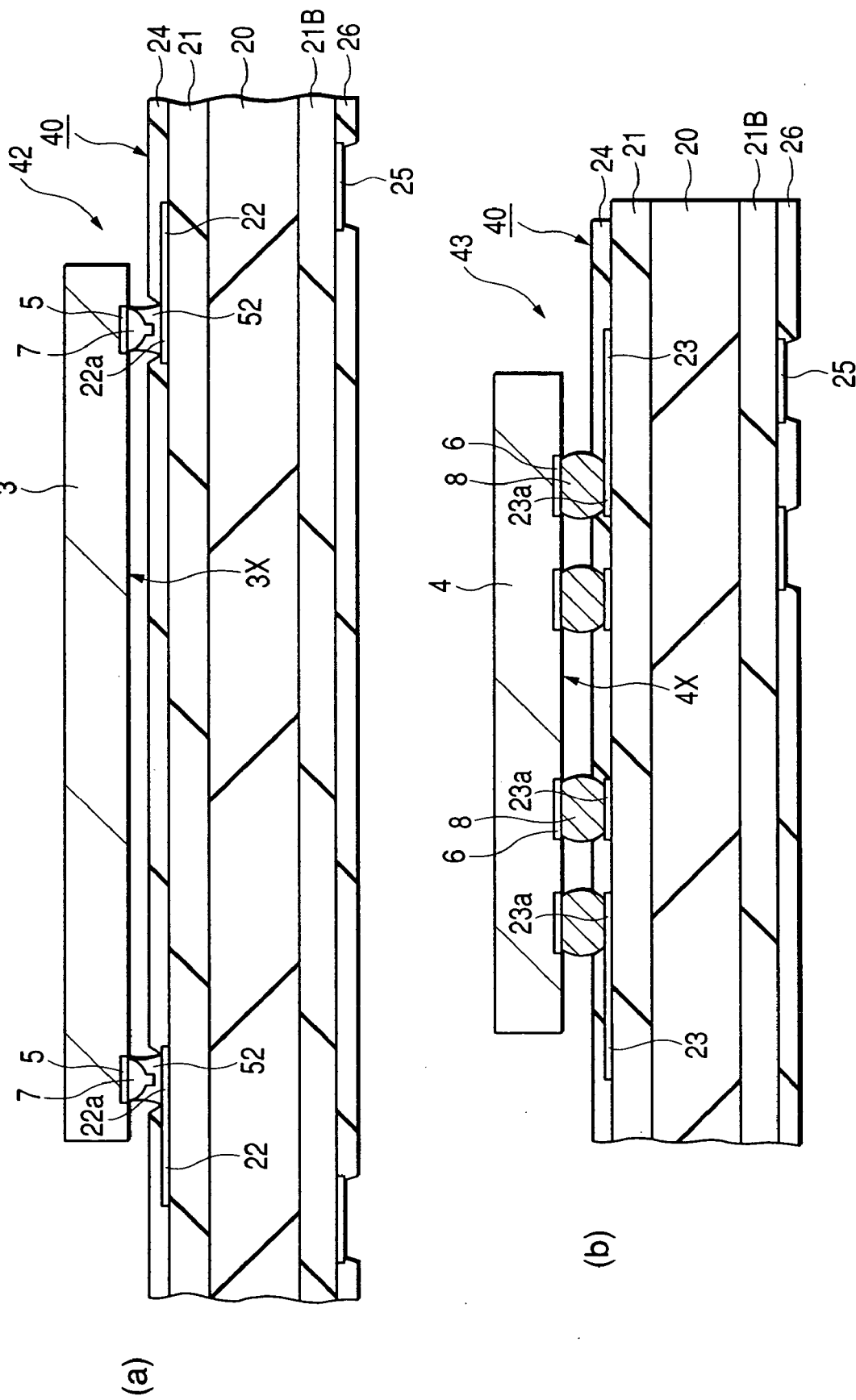
FIG. 22 is a cross-sectional view of an essential part for explaining the manufacture of the MCM shown in FIG. 16 ((a) being a cross-sectional view taken at a position along a line C—C in FIG. 16, (b) being a cross-sectional view taken at a position along a line D—D in FIG. 16).

Next, the printed wiring board 40 is conveyed to an infrared ray reflow furnace, for example, so as to melt the solder bumps 8. Thereafter, the melted solder bumps 8 are solidified. Accordingly, as shown in FIG. 22, the semiconductor chips 4 are mounted on the respective chip mounting regions 43 of the plurality of board forming regions 41 formed over one main surface of the printed wiring board 40.

Here, since the stud bump 7 and the bonding material 52 are formed of a material having a melting point higher than a melting point of the solder bump 8, the stud bump 7 and the bonding material 52 are not melted at the time of melting the solder bump 8.

Further, when the semiconductor 3 and the semiconductor chips 4 are collectively mounted, since the stud bumps 7 are smaller than the solder bumps 8, at the time of conveying the printed wiring board 40 to the reflow furnace or at the time of performing the reflow, the positional displacement that the stud bumps 7 are displaced from the connection portions 22*a* is liable to easily occur. However, as in the case of this embodiment, by mounting the semiconductor 3 using the bonding material 52 made of the material having a melting point higher than a melting point of the solder bump 8 before conveying the printed wiring board 40 to the reflow furnace and mounting the semiconductor chip 4, at the time of conveying the printed wiring board 40 to the reflow furnace or at the time of performing the reflow, the positional displacement that the stud bumps 7*a* are displaced from the connection portions 22*a* does not occur and hence, it is possible to suppress the connection failure between the connecting portions 22a of the printed wiring board 40 and the stud bumps 7.

Figure 23:
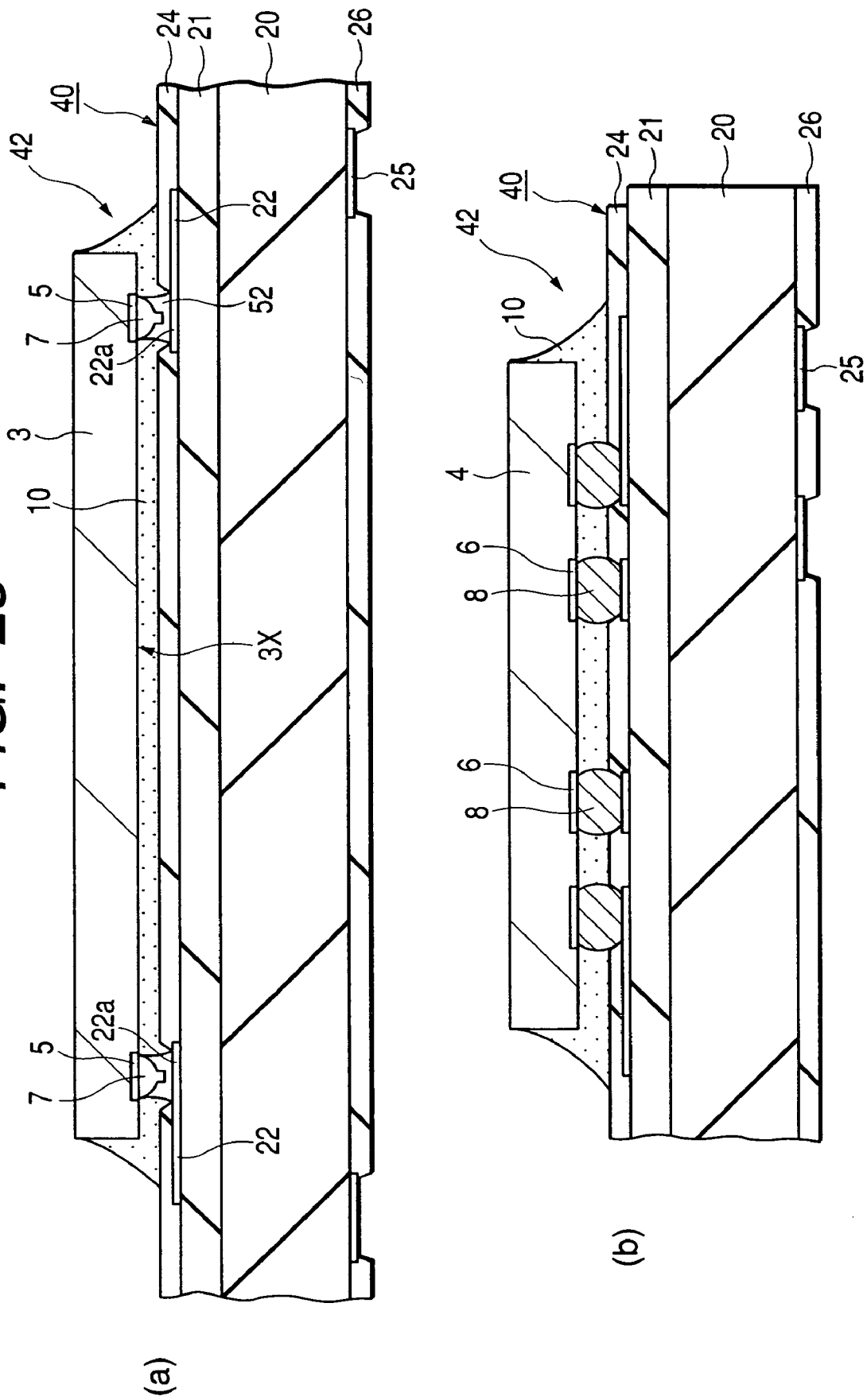
FIG. 23 is a cross-sectional view of an essential part for explaining the manufacture of the MCM shown in FIG. 16 ((a) being a cross-sectional view taken at a position along a line C—C in FIG. 16, (b) being a cross-sectional view taken at a position along a line D—D in FIG. 16).

Next, as shown in FIG. 23, in a gap region defined between the chip mounting region 42 formed over one main surface of the printed wiring board 40 and the semiconductor chip 3 as well as in a gap region defined between the chip mounting region 43 formed over one main surface of the printed wiring board 40 and the semiconductor chip 4, an underfill resin 10 is filled.

Here, when the underfill resin 10 is filled between the printed wiring board 40 and the semiconductor chip 3 after mounting the semiconductor chip 3 and before mounting the semiconductor chip 4, due to spreading of wetting of the underfill resin 10, there exists a possibility that the connecting portion 23a of the chip mounting region 43 is covered with the underfill resin 10 and hence, it is necessary to widen the distance between the chip mounting regions 42, 43. However, by filling the underfill resin 10 after mounting the semiconductor chip 4 as in the case of this embodiment, there is no possibility that the connecting portion 23a of the chip mounting region 43 is covered due to spreading of wetting of the underfill resin 10 and hence, it is possible to narrow the distance between the chip mounting regions 42 and 43.

Further, when the underfill resin 10 is filled in the gap region defined between the printed wiring board 40 and the semiconductor chip 3 before mounting the semiconductor chip 4 and the underfill resin 10 is filled in the gap region defined between the printed wiring board 40 and the semiconductor chip 4 after mounting the semiconductor chip 4, heat generated in the step of mounting the semiconductor 4 is applied to the underfill resin 10 which is already filled. However, as in the case of this embodiment, by filling the underfill resin 10 into the gap region defined between the chip mounting region 42 formed over one main surface of the printed wiring board 40 and the semiconductor chip 3 and into the gap region defined between the chip mounting region 43 formed over one main surface of the printed wiring board 40 and the semiconductor chip 4 after steps of mounting the semiconductor chip 3 and the semiconductor chip 4, it is possible to prevent the heat generated in the step of mounting the semiconductor chip 3 or the semiconductor 4 from being applied to the previously filled underfill resin 10 and hence, it is possible to prevent the cracks which occur in the underfill resin 10 attributed to the rupture of bonding in the resin. Further, by filling the underfill resin 10 in the same step, it is possible to simplify the number of manufacturing steps.

Thereafter, by performing the steps substantially equal to the steps of the above-mentioned embodiment 1, it is possible to substantially complete the MCM-1C shown in FIG. 16 and FIG. 17.

In this manner, according to this embodiment, it is possible to obtain following advantageous effects.

(1) In the manufacture of the MCM-1C, before conveying the printed wiring board 40 to the reflow furnace and mounting the semiconductor chips (solder-bump semiconductor chips) 4, the semiconductor chip (stud-bump connection semiconductor chip) 3 is mounted using the bonding material 52 made of the material having a melting point higher than a melting point of the solder bump 8. Accordingly, at the time of conveying the printed wiring board 40 to the reflow furnace or at the time of performing the reflow, the positional displacement that the stud bumps 7 are displaced from the connection portions 22a does not occur and hence, it is possible to suppress the connection failure between the connecting portions 22a of the printed wiring board 40 and the stud bumps 7. As a result, it is possible to enhance a yield rate of the MCM-1C.

(2) In the manufacture of the MCM-1C, by filling the underfill resin 10 after mounting the semiconductor chips 3 and 4, there is no possibility that the connecting portion 23a of the chip mounting regions 42 and 43 is covered due to spreading of wetting of the underfill resin 10 and hence, it is possible to narrow the distance between the chip mounting regions 42 and 43. As a result, the MCM-1C can be miniaturized.

(3) In the manufacture of the MCM-1C, by filling the underfill resin 10 into the gap region defined between the chip mounting region 42 formed over one main surface of the printed wiring board 40 and the semiconductor chip 3 and into the gap region defined between the chip mounting region 43 formed over one main surface of the printed wiring board 40 and the semiconductor chip 4 after the step of mounting the semiconductor chips 3 and 4, it is possible to prevent the heat generated in the step of mounting the semiconductor chip 3 and the semiconductor chip 4 from being applied to the underfill resin 10 and hence, it is possible to prevent the cracks which occur in the underfill resin 10 attributed to the rupture of bonding in the resin. As a result, it is possible to suppress the lowering of the mechanical strength of the underfill resin 10 whereby the rupture of the stud bumps 7 attributed to the difference in thermal expansion coefficient between the semiconductor chip 3 and the printed wiring board 2 can be suppressed. Further, by filling the underfill resin 10 in the same step, it is possible to simplify the number of manufacturing steps.

Here, although the explanation is made with respect to the example in which the semiconductor chip 4 is used as an electronic component having the solder bumps in this embodiment, the CSP type semiconductor device 60 shown in FIG. 15 may be used as the electronic component having the solder bumps.

Further, although the explanation is made with respect to the example in which the bonding material 52 in a paste form is supplied to the connecting portions 22a using the dispense method in this embodiment, the MCM may be manufactured by using the printed wiring board in which bonding material in a solid form is preliminarily formed over the connecting portions 22a.

(Embodiment 4)

Figure 25:
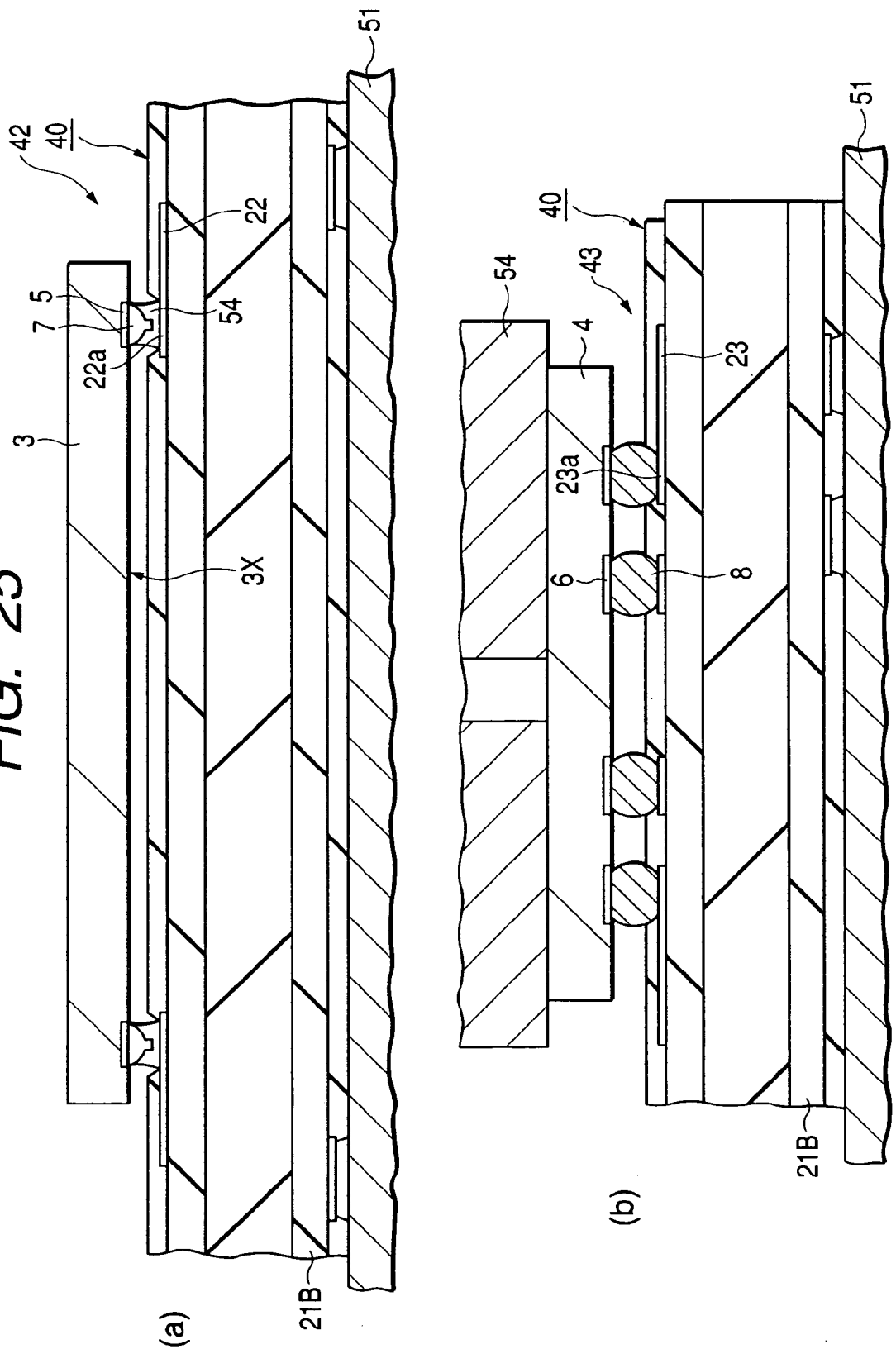
FIG. 25 is a cross-sectional view of an essential part for explaining the manufacture of an MCM of the embodiment 4 of the present invention((a) being a cross-sectional view taken at the same position as a line C—C in FIG. 16, (b) being a cross-sectional view taken at the same position as a line D—D in FIG. 16).

FIG. 24 and FIG. 25 are cross-sectional views of an essential part for explaining the manufacture of an MCM of an embodiment 4 of the present invention((a) being a cross-sectional view taken at the same position as a line C—C in FIG. 16, (b) being a cross-sectional view taken at the same position as a line D—D in FIG. 16). The manufacture of the MCM of this embodiment is explained hereinafter in conjunction with FIG. 24 and FIG. 25.

First of all, the printed wiring board 40 for taking plural pieces shown in FIG. 9 is prepared and, at the same time, the semiconductor chip (stud-bump connection semiconductor chip) 3 shown in FIG. 6 and the semiconductor chips (solder-bump connection semiconductor chip) 4 shown in FIG. 7 are prepared.

Next, as shown in FIG. 24, before mounting the semiconductor chips 4, the semiconductor chips 3 are mounted on respective chip mounting regions of a plurality of board forming regions 41 on one main surface of the printed wiring board 40. Mounting of the semiconductor chips 3 is performed in the same manner as the previously-mentioned embodiment 3. However, as the bonding material 52, this embodiment uses a solder paste material in which solder particles of 63 [wt %]Pb(lead)—37 [wt %]Sn(tin) composition having a melting point of approximately 183° C., for example, are mixed.

Next, as shown in FIG. 25, the semiconductor chips 4 are mounted on respective chip mounting regions 43 of a plurality of board forming regions 41 formed over one main surface of the printed wiring board 40. Mounting of the semiconductor chips 4 is performed as follows. A flux is supplied to the connecting portions 23a by a dispense method, for example. Thereafter, the semiconductor chips 4 are conveyed onto the chip mounting region 43 by a collet 54 such that the solder bumps 8 are positioned above the connecting portions 23a. Thereafter, the printed wiring board 40 is heated using a heat stage 51 and, at the same time, the semiconductor chips 4 are heated by the collet 54 so as to melt the solder bumps 8. Thereafter, melted solder bumps 8 are solidified. Mounting of the semiconductor chips 4 are performed for respective chip mounting regions 43 of a plurality of board forming regions 41 formed over one main surface of the printed wiring board 40.

Thereafter, by applying steps substantially equal to those of the previously-mentioned embodiment 3, the MCM is almost completed.

In this embodiment, at the time of mounting the semiconductor chips (stud-bump-mounting semiconductor chips) 3, mounting of the semiconductor chips 3 is performed in a state that the semiconductor chips are pushed by the collets 53 and hence, even when the semiconductor chip 3 has electrode pads with a narrow arrangement pitch, it is possible to mount the semiconductor chip 3 without the positional displacement. Further, at the time of mounting the semiconductor chips 4, the semiconductor chips 4 are selectively heated by the collet 54 such that the temperature of the semiconductor chips 4 is set higher than the temperature of the semiconductor chips 3 and, at the same time, the temperature of the semiconductor chips 3 is set not higher than a melting point of the bonding material 52. Accordingly, it is possible to mount the semiconductor chips 4 without melting the bonding material 52. As a result, it is possible to enhance a yield rate of the MCM. Further, due to such a method, as the bonding material 52, it is also possible to adopt a material which has a melting point equal to a melting point of the solder bumps 8 or lower than a melting point of the solder bumps 8.

Here, in this embodiment, although the explanation is made with respect to the example in which the semiconductor chips (stud-bump connection semiconductor chip) 3 are mounted prior to mounting of the semiconductor chips 4 (solder-bump connection semiconductor chips) 4, it is possible to obtain the substantially same advantageous effect by mounting the semiconductor chips 4 prior to mounting of the semiconductor chips 3.

(Embodiment 5)

Figure 26:
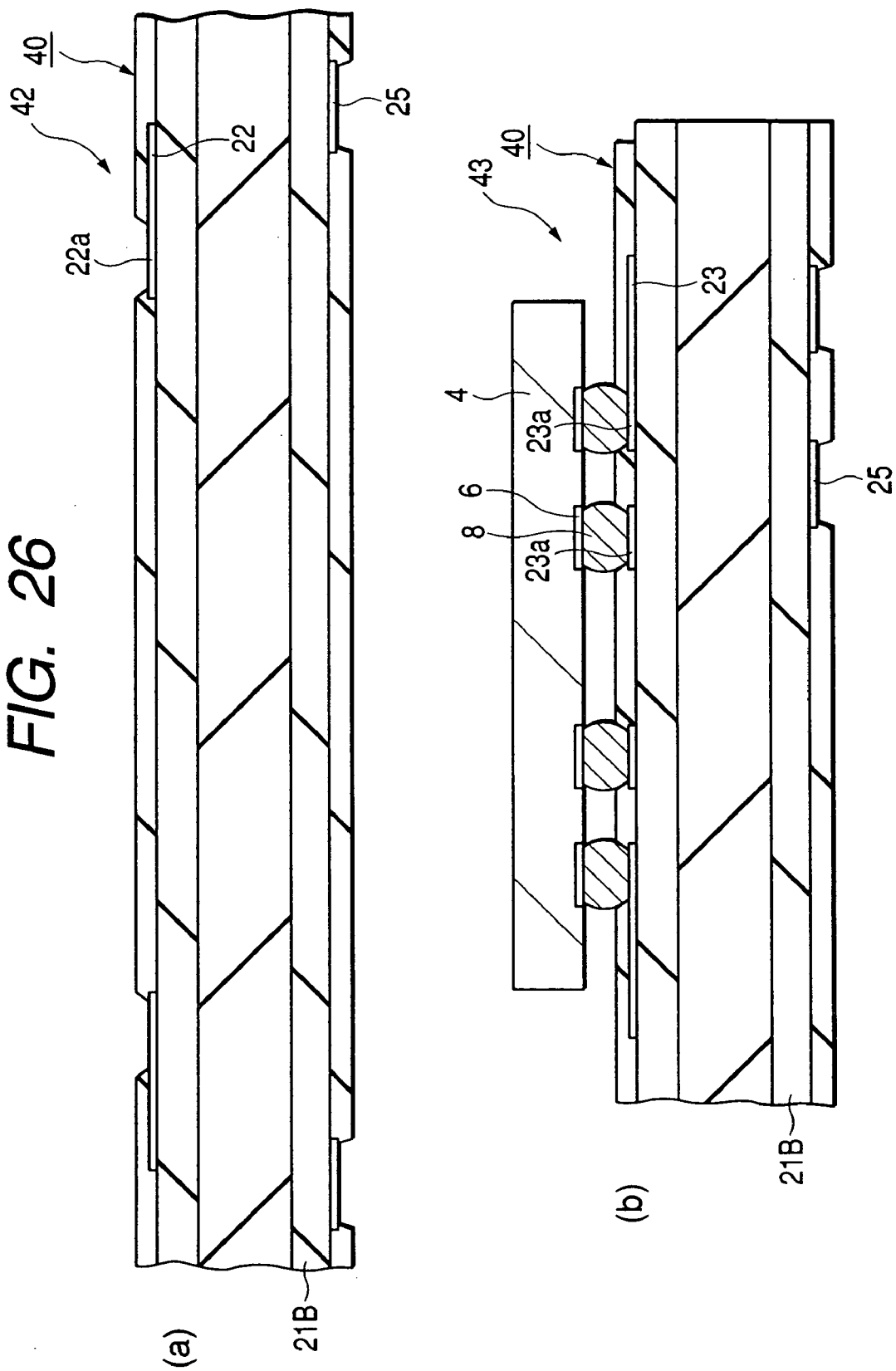
FIG. 26 is a cross-sectional view of an essential part for explaining the manufacture of an MCM of an embodiment 5 of the present invention((a) being a cross-sectional view taken at the same position as a line C—C in FIG. 16, (b) being a cross-sectional view taken at the same position as a line D—D in FIG. 16).
Figure 27:
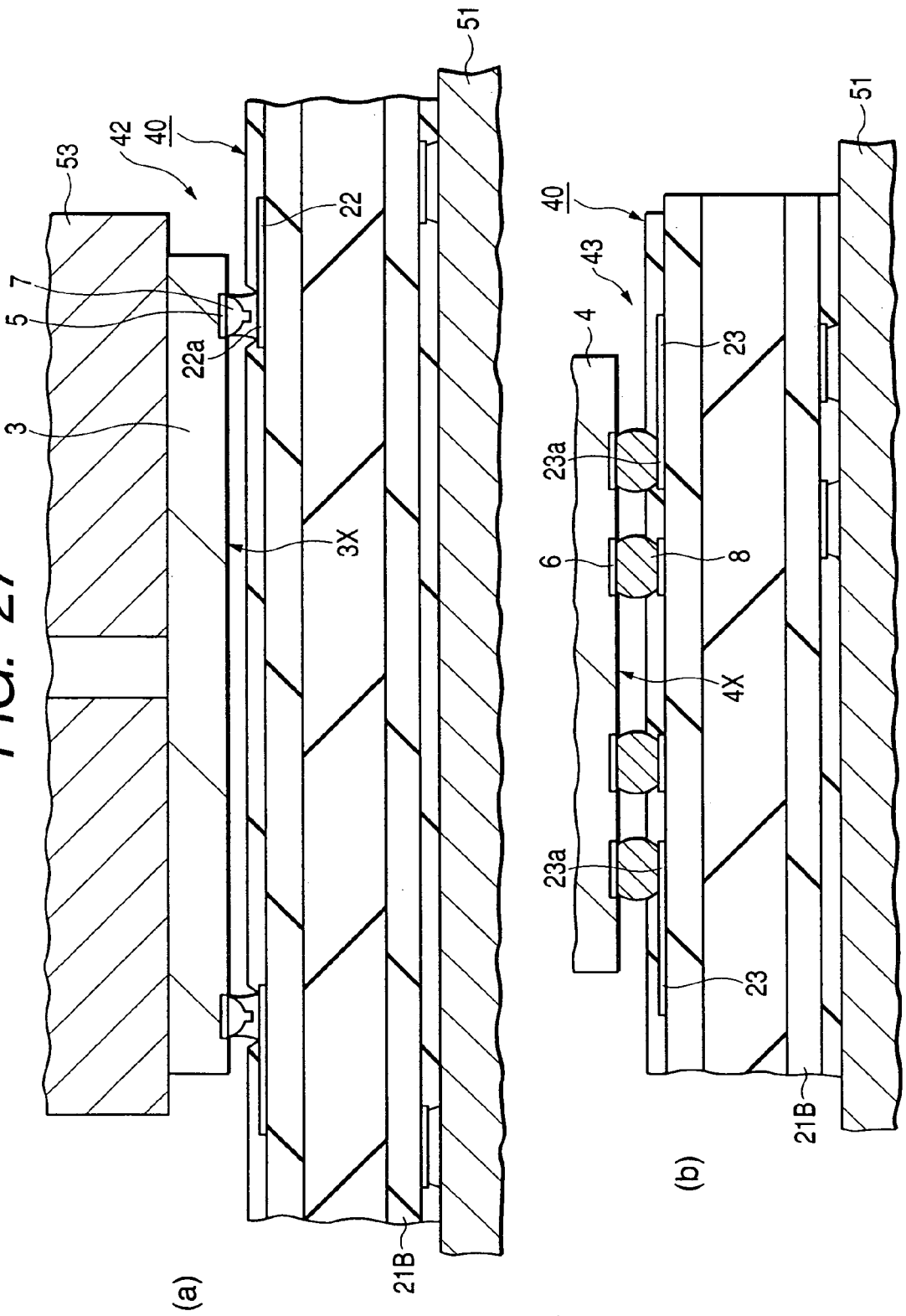
FIG. 27 is a cross-sectional view of an essential part for explaining the manufacture of an MCM of the embodiment 5 of the present invention ((a) being a cross-sectional view taken at the same position as a line C—C in FIG. 16, (b) being a cross-sectional view taken at the same position as a line D—D in FIG. 16).

FIG. 26 and FIG. 27 are cross-sectional views of an essential part for explaining the manufacture of an MCM of an embodiment 5 of the present invention ((a) being a cross-sectional view taken at the same position as a line C—C in FIG. 16, (b) being a cross-sectional view taken at the same position as a line D—D in FIG. 16). Hereinafter, the manufacture of the MCM of this embodiment is explained in conjunction with FIG. 26 and FIG. 27.

First of all, the printed wiring board 40 for taking plural pieces shown in FIG. 9 is prepared and, at the same time, the semiconductor chip (stud-bump connection semiconductor chip) 3 shown in FIG. 6 and the semiconductor chips (solder-bump connection semiconductor chip) 4 shown in FIG. 7 are prepared.

Next, as shown in FIG. 26, before mounting the semiconductor chips 3, the semiconductor chips 4 are mounted on respective chip mounting regions 43 of a plurality of board forming regions 41 on one main surface of the printed wiring board 40. Mounting of the semiconductor chips 4 is performed as follows. A flux is supplied by a screen printing method, for example, to connecting portions 23a which are arranged in respective chip mounting regions 43 of a plurality of board forming regions 41 formed over one main surface of the printed wiring board 40. Thereafter, the semiconductor chips 4 are arranged on the respective chip mounting regions 43 of a plurality of board forming regions 41 such that the solder bumps 8 are positioned on the connecting portions 23a. Thereafter, the printed wiring board 40 is conveyed to an infrared ray reflow furnace, for example, to melt the solder bumps 8. Thereafter, the melted solder bumps 8 are solidified.

Next, the semiconductor chips 3 are mounted on respective chip mounting regions 42 of a plurality of board forming regions 41 formed over one main surface of the printed wiring board 40. Mounting of the semiconductor chips 4 is performed as follows. First of all, a bonding material 52 in a paste form is supplied by a dispense method, for example, to the connecting portions 22a arranged on respective chip mounting regions 42 of the plurality of board forming regions 41 formed over one main surface of the printed wiring board 40. Thereafter, as shown in FIG. 27, the printed wiring board 40 is arranged on a heat stage 51. Then, the semiconductor chips 3 are conveyed onto the chip mounting region 42 by a collet 53 such that the stud bumps 7 are positioned above the connecting portions 22a. Thereafter, the printed wiring board 40 is heated using a heat stage 51 and, at the same time, the semiconductor chips 3 are heated by the collet 53 so as to melt the bonding material 52 as shown in FIG. 27. Thereafter, melted bonding material 52 is solidified. Mounting of the semiconductor chips 3 is performed for respective chip mounting regions 42 of a plurality of board forming regions 41.

Thereafter, by applying steps substantially equal to those of the previously-mentioned embodiment 3, the MCM is almost completed.

In this embodiment, after mounting the semiconductor chips (solder-bump connection semiconductor chips) 4, mounting of the semiconductor chips 4 is performed in a state that the semiconductor chips 3 are pressed by the collets 53 and hence, even when the semiconductor chip 3 has electrode pads with a narrow arrangement pitch, it is possible to mount the semiconductor chip 3 without the positional displacement. Further, at the time of mounting the semiconductor chips 3, the semiconductor chips 3 are selectively heated by the collet 53 such that the temperature of the semiconductor chips 3 is set higher than the temperature of the semiconductor chips 4. Accordingly, it is possible to mount the semiconductor chips 3 without melting the solder bumps 8. As a result, it is possible to enhance a yield rate of the MCM.

Further, to the connecting portions 23a which have a large pitch compared to a pitch of the connecting portions 22a, the flux or the solder paste can be supplied by a screen printing method. Then, by collectively performing the supply of flux to a plurality of connecting portions 23a by a screen printing method, compared to a case in which the flux is supplied to every connecting portion 23a by a dispense method, it is possible to shorten the step. Further, by performing the step of supplying flux using the screen printing before mounting the semiconductor chips 3, it is possible to narrow the distance between the chip mounting region 42 and the chip mounting region 43 in the inside of the respective board forming regions 41. As a result, the MCM can be miniaturized.

Although the inventions made by the inventors have been specifically explained based on the above-mentioned embodiments, it is needless to say that the present inventions are not limited to the above-mentioned embodiments and various modifications can be made within a range without departing from the gist of the present inventions.

To briefly explain the advantageous effects obtained by typical inventions among the inventions disclosed by the present application, they are as follows.

According to the present invention, it is possible to enhance the reliability of the electronic device.

According to the present invention, it is possible to enhance the manufacturing yield rate of the electronic device.

INDUSTRIAL APPLICABILITY

As has been explained heretofore, the electronic device according to the present invention is advantageously used as the electronic device which mounts electronic components which differ in types of projection electrodes on the same board in a mixed form and, more particularly, the electronic device according to the present invention is advantageously used as the MCM which mounts the solder-bump connection chips and the stud-bump connection chips on the same board in a mixed form.

The invention claimed is:

1. A manufacturing method of an electronic device comprising the steps of:
   preparing a printed wiring board having a first region and a second region which differ from each other over one main surface thereof, a first electronic component having a plurality of first projection electrodes over one main surface thereof, and a second electronic component having a plurality of second projection electrodes which have a melting point higher than a melting point of the first projection electrodes over one main surface thereof;
   mounting the first electronic component to the first region of one main surface of the printed wiring board by melting the plurality of first projection electrodes; and
   mounting the second electronic component to the second region of one main surface of the printed wiring board by compression-bonding the second electronic component while heating in a state that an adhesive resin is interposed between the second region of one main surface of the printed wiring board and one main surface of the second electronic component,
   wherein the step of mounting the second electronic component is performed after the step of mounting the first electronic component.

2. A manufacturing method of an electronic device according to claim 1, wherein the adhesive resin is a thermosetting insulation resin.

3. A manufacturing method of an electronic device according to claim 2, wherein the thermosetting insulation resin is an epoxy-based resin.

4. A manufacturing method of an electronic device according to claim 2, wherein the thermosetting insulation resin is a sheet-like or a paste-like resin.

5. A manufacturing method of an electronic device according to claim 1, wherein the adhesive resin is an anisotropic conductive resin which is produced by mixing a large number of conductive particles in the inside of a thermosetting insulation resin.

6. A manufacturing method of an electronic device according to claim 5, wherein the thermosetting insulation resin is an epoxy-based resin.

7. A manufacturing method of an electronic device according to claim 5, wherein the anisotropic conductive resin is a sheet-like or a paste-like resin.

8. A manufacturing method of an electronic device according to claim 1,
   wherein the first projection electrodes are solder bumps, and
   wherein the second projection electrodes are stud bumps.

9. A manufacturing method of an electronic device according to claim 1, wherein an arrangement pitch of the plurality of second projection electrodes is smaller than an arrangement pitch of the plurality of first projection electrodes.

10. A manufacturing method of an electronic device according to claim 1, wherein the first and the second electronic components are formed of a semiconductor chip in which a circuit is incorporated.

11. A manufacturing method of an electronic device according to claim 1,
    wherein the first electronic component is formed of a semiconductor chip which includes: a semiconductor substrate; a plurality of semiconductor elements which are formed over one main surface of the semiconductor substrate; a plurality of first electrode pads which are formed over one main surface of the semiconductor substrate; a plurality of second electrode pads which are formed as a layer above the plurality of first electrode pads and are respectively electrically connected to the plurality of first electrode pads, the plurality of second electrode pads being arranged at an arrangement pitch wider than an arrangement pitch of the plurality of first electrode pads; and the plurality of first projection electrodes which are respectively connected to the plurality of second electrode pads, and
    wherein the second electronic component is formed of a semiconductor chip which includes a semiconductor substrate, a plurality of semiconductor elements which are formed over one main surface of the semiconductor substrate, a plurality of electrode pads which are formed over one main surface of the semiconductor substrate, and the plurality of second projection electrodes which are respectively connected to the plurality of electrode pads.

12. A manufacturing method of an electronic device comprising the steps of:
    (a) preparing a printed wiring board having a first region and a second region which differ from each other over one main surface thereof, wherein a plurality of first connecting portions are arranged in the first region and a plurality of second connecting portions are arranged in the second region, a first electronic component having a plurality of first projection electrodes over one main surface thereof, and a second electronic component having a plurality of second projection electrodes which have a melting point higher than a melting point of the first projection electrodes over one main surface thereof;
    (b) electrically connecting the plurality of second connecting portions and the plurality of second projection electrodes to each other by melting a bonding material having a melting point higher than a melting point of the first projection electrodes and lower than a melting point of the second projection electrodes; and (c) electrically connecting the plurality of first connecting portions and the plurality of first projection electrodes by melting the plurality of first projection electrodes, wherein the step (b) is performed before the step (c).

13. A manufacturing method of an electronic device according to claim 12, wherein the plurality of first projection electrodes are solder bumps, and wherein the plurality of second projection electrodes are stud bumps.

14. A manufacturing method of an electronic device according to claim 12, wherein an arrangement pitch of the plurality of second projection electrodes is smaller than an arrangement pitch of the plurality of first projection electrodes.

15. A manufacturing method of an electronic device according to claim 12, wherein the first and the second electronic components are formed of a semiconductor chip in which a circuit is incorporated.

16. A manufacturing method of an electronic device according to claim 12, wherein the first electronic component is formed of a semiconductor chip which includes: a semiconductor substrate; a plurality of semiconductor elements which are formed over one main surface of the semiconductor substrate; a plurality of first electrode pads which are formed over one main surface of the semiconductor substrate; a plurality of second electrode pads which are formed as a layer above the plurality of first electrode pads and are respectively electrically connected to the plurality of first electrode pads, the plurality of second electrode pads being arranged at an arrangement pitch wider than an arrangement pitch of the plurality of first electrode pads; and the plurality of first projection electrodes which are respectively connected to the plurality of the second electrode pads, and wherein the second electronic component is formed of a semiconductor chip which includes a semiconductor substrate, a plurality of semiconductor elements which are formed over one main surface of the semiconductor substrate, a plurality of electrode pads which are formed over one main surface of the semiconductor substrate, and the plurality of second projection electrodes which are respectively connected to the plurality of electrode pads.

17. A manufacturing method of an electronic device according to claim 12, wherein the first electronic component is a semiconductor device which packages a semiconductor chip incorporating a circuit therein, and wherein the second electronic component is a semiconductor chip incorporating a circuit therein.

18. A manufacturing method of an electronic device according to claim 12, wherein the first electronic component is a semiconductor device which includes a printed wiring board, a semiconductor chip being arranged over one main surface side of the printed wiring board and incorporating a circuit therein, and the plurality of first projection electrodes which are arranged over another main surface side facing one main surface of the printed wiring board in an opposed manner, and wherein the second electronic component is a semiconductor chip incorporating a circuit therein.

19. A manufacturing method of an electronic device according to claim 12, further including, after the step (b), a step of:

filling an underfill resin between the first region formed over one main surface of the printed wiring board and the first electronic component as well as between the second region formed over one main surface of the printed wiring board and the second electronic component.

20. A manufacturing method of an electronic device comprising the steps of:

(a) preparing a printed wiring board having a first region and a second region which differ from each other over one main surface thereof, wherein a plurality of first connecting portions are arranged over the first region and a plurality of second connecting portions are arranged over the second region, a first electronic component having a plurality of first projection electrodes over one main surface thereof, and a second electronic component having a plurality of second projection electrodes which have a melting point higher than a melting point of the first projection electrodes over one main surface thereof;

(b) electrically connecting the plurality of first connecting portions and the plurality of first projection electrodes by melting the plurality of first projection electrodes, and (c) after the step (b), electrically connecting the plurality of second connecting portions and the plurality of second projection electrodes to each other by melting a bonding material having a melting point lower than a melting point of the second projection electrodes.

21. A manufacturing method of an electronic device according to claim 20, wherein the plurality of first projection electrodes are solder bumps, and wherein the plurality of second projection electrodes are stud bumps.

22. A manufacturing method of an electronic device according to claim 20, wherein an arrangement pitch of the plurality of second projection electrodes is smaller than an arrangement pitch of the plurality of first projection electrodes.

23. A manufacturing method of an electronic device according to claim 20, wherein the first and the second electronic components are formed of a semiconductor chip in which a circuit is incorporated.

24. A manufacturing method of an electronic device according to claim 20, wherein the first electronic component is formed of a semiconductor chip which includes: a semiconductor substrate; a plurality of semiconductor elements which are formed over one main surface of the semiconductor substrate; a plurality of first electrode pads which are formed over one main surface of the semiconductor substrate; a plurality of second electrode pads which are formed as a layer above the plurality of first electrode pads and are respectively electrically connected to the plurality of first electrode pads, the plurality of second electrode pads being arranged at an arrangement pitch wider than an arrangement pitch of the plurality of first electrode pads; and the plurality of first projection electrodes which are respectively connected to the plurality of the second electrode pads, and wherein the second electronic component is formed of a semiconductor chip which includes a semiconductor substrate, a plurality of semiconductor elements which are formed over one main surface of the semiconductor substrate, a plurality of electrode pads which are formed over one main surface of the semiconductor substrate, and the plurality of second projection electrodes which are respectively connected to the plurality of electrode pads.

25. A manufacturing method of an electronic device according to claim 20,
wherein the first electronic component is a semiconductor device which packages a semiconductor chip incorporating a circuit therein, and
wherein the second electronic component is a semiconductor chip incorporating a circuit therein.

26. A manufacturing method of an electronic device according to claim 20,
wherein the first electronic component is a semiconductor device which includes a printed wiring board, a semiconductor chip being arranged over one main surface side of the printed wiring board and incorporating a circuit therein, and the plurality of first projection electrodes which are arranged over another main surface side facing one main surface of the printed wiring board in an opposed manner, and
wherein the second electronic component is a semiconductor chip incorporating a circuit therein.

27. A manufacturing method of an electronic device according to claim 20, further including, after the step (c), a step of filling an underfill resin between the first region formed over one main surface of the printed wiring board and the first electronic component.

28. A manufacturing method of an electronic device according to claim 20, further including, after the step (c), a step of filling an underfill resin between the first region formed over one main surface of the printed wiring board and the first electronic component as well as between the second region formed over one main surface of the printed wiring board and the second electronic component.

29. A manufacturing method of an electronic device comprising the steps of:
(a) preparing a printed wiring board having a first region and a second region which differ from each other, wherein a plurality of first connecting portions are arranged over the first region and a plurality of second connecting portions are arranged over the second region, a first electronic component having a plurality of first projection electrodes over one main surface thereof, and a second electronic component having a plurality of second projection electrodes over one main surface thereof;
(b) electrically connecting the plurality of second connecting portions and the plurality of second projection electrodes by melting a bonding material having a melting point lower than a melting point of the second projection electrodes; and
(c) after the second step, electrically connecting the plurality of first connecting portions and the plurality of first projection electrodes to each other by melting the plurality of first projection electrodes,
wherein the step (c) is performed by heating the first electronic component such that a temperature of the first electronic component becomes higher than a temperature of the second electronic component.

30. A manufacturing method of an electronic device according to claim 29,
wherein the plurality of first projection electrodes are solder bumps, and
wherein the plurality of second projection electrodes are stud bumps.

31. A manufacturing method of an electronic device according to claim 29, wherein an arrangement pitch of the plurality of second projection electrodes is smaller than an arrangement pitch of the plurality of first projection electrodes.

32. A manufacturing method of an electronic device according to claim 29, wherein the first and the second electronic components are formed of a semiconductor chip in which a circuit is incorporated.

33. A manufacturing method of an electronic device according to claim 29,
wherein the first electronic component is formed of a semiconductor chip which includes: a semiconductor substrate; a plurality of semiconductor elements which are formed over one main surface of the semiconductor substrate; a plurality of first electrode pads which are formed over one main surface of the semiconductor substrate; a plurality of second electrode pads which are formed as a layer above the plurality of first electrode pads and are respectively electrically connected to the plurality of first electrode pads, the plurality of second electrode pads being arranged at an arrangement pitch wider than an arrangement pitch of the plurality of first electrode pads; and the plurality of first projection electrodes which are respectively connected to the plurality of the second electrode pads, and
wherein the second electronic component is formed of a semiconductor chip which includes a semiconductor substrate, a plurality of semiconductor elements which are formed over one main surface of the semiconductor substrate, a plurality of electrode pads which are formed over one main surface of the semiconductor substrate, and the plurality of second projection electrodes which are respectively connected to the plurality of electrode pads.

34. A manufacturing method of an electronic device according to claim 29,
wherein the first electronic component is a semiconductor device which packages a semiconductor chip incorporating a circuit therein, and
wherein the second electronic component is a semiconductor chip incorporating a circuit therein.

35. A manufacturing method of an electronic device according to claim 29,
wherein the first electronic component is a semiconductor device which includes a printed wiring board, a semiconductor chip being arranged over one main surface side of the printed wiring board and incorporating a circuit therein, and the plurality of first projection electrodes which are arranged over another main surface side facing one main surface of the printed wiring board in an opposed manner, and
wherein the second electronic component is a semiconductor chip incorporating a circuit therein.

36. A manufacturing method of an electronic device according to claim 29, further including, after the step (c), a step of filling an underfill resin between the first region formed over one main surface of the printed wiring board and the first electronic component.

37. A manufacturing method of an electronic device according to claim 29, further including, after the step (c), a step of filling an underfill resin between the first region formed over one main surface of the printed wiring board and the first electronic component as well as between the second region formed over one main surface of the printed wiring board and the second electronic component.

* * * * *